US009627186B2

(12) United States Patent
Valcore, Jr. et al.

(10) Patent No.: US 9,627,186 B2
(45) Date of Patent: Apr. 18, 2017

(54) SYSTEM, METHOD AND APPARATUS FOR USING OPTICAL DATA TO MONITOR RF GENERATOR OPERATIONS

(71) Applicant: Lam Research Corporation, Fremont, CA (US)

(72) Inventors: John C. Valcore, Jr., Berkeley, CA (US); Tony San, Sunnyvale, CA (US); Seonkyung Lee, San Ramon, CA (US)

(73) Assignee: Lam Research Corporation, Freemont, CA (US)

( * ) Notice: Subject to any disclaimer, the term of this patent is extended or adjusted under 35 U.S.C. 154(b) by 47 days.

(21) Appl. No.: 14/554,006

(22) Filed: Nov. 25, 2014

(65) Prior Publication Data

US 2016/0064199 A1 Mar. 3, 2016

Related U.S. Application Data

(60) Provisional application No. 62/044,181, filed on Aug. 29, 2014.

(51) Int. Cl.
*H01J 37/32* (2006.01)
*G01J 1/44* (2006.01)

(52) U.S. Cl.
CPC .. *H01J 37/32935* (2013.01); *H01J 37/32183* (2013.01); *H01J 37/32972* (2013.01)

(58) Field of Classification Search
CPC ........... H01J 37/32935; H01J 37/32972; H01J 27/32183; H01J 37/32082; H01J 37/32174; H01J 37/32926; H01J 37/32917; G01J 1/44
See application file for complete search history.

(56) References Cited

U.S. PATENT DOCUMENTS

| 4,385,208 A | * | 5/1983 | Tow ....................... H04Q 1/453 324/76.31 |
| 5,552,016 A | * | 9/1996 | Ghanayem ........ H01J 37/32935 156/345.25 |
| 5,565,114 A | * | 10/1996 | Saito ..................... G01N 21/68 156/345.25 |
| 5,809,085 A | * | 9/1998 | Goodson .................. H03D 1/06 375/320 |
| 5,929,717 A | * | 7/1999 | Richardson ........... H01J 37/321 315/111.21 |

(Continued)

*Primary Examiner* — John Lee
(74) *Attorney, Agent, or Firm* — Martine Penilla Group, LLP

(57) ABSTRACT

A system and method monitoring a plasma with an optical sensor to determine the operations of a pulsed RF signal for plasma processing including a plasma chamber with an optical sensor directed toward a plasma region. An RF generator coupled to the plasma chamber through a match circuit. An RF timing system coupled to the RF generator. A system controller is coupled to the plasma chamber, the RF generator, the optical sensor, the RF timing system and the match circuit. The system controller includes a central processing unit, a memory system, a set of RF generator settings and an optical pulsed plasma analyzer coupled to the optical sensor and being capable to determine a timing of a change in state of an optical emission received in the optical sensor and/or a set of amplitude statistics corresponding to an amplitude of the optical emission received in the optical sensor.

15 Claims, 22 Drawing Sheets

(56) References Cited

U.S. PATENT DOCUMENTS

| | | | | |
|---|---|---|---|---|
| 5,989,928 A * | 11/1999 | Nakata | | B24B 37/013 156/345.25 |
| 6,060,837 A * | 5/2000 | Richardson | | H01J 37/321 315/111.51 |
| 6,104,487 A * | 8/2000 | Buck | | G01N 21/68 216/60 |
| 6,160,621 A * | 12/2000 | Perry | | G01B 11/0683 250/559.27 |
| 6,231,774 B1 * | 5/2001 | Saito | | H01J 37/32935 216/60 |
| 6,455,437 B1 * | 9/2002 | Davidow | | H01J 37/32082 438/710 |
| 6,627,463 B1 * | 9/2003 | Sarfaty | | H01L 21/3144 257/E21.268 |
| 6,741,345 B2 * | 5/2004 | Sabsabi | | G01N 21/15 250/432 R |
| 6,911,157 B2 * | 6/2005 | Edamura | | H01J 37/3299 156/345.24 |
| 6,982,175 B2 * | 1/2006 | Johnson | | H01J 37/32963 216/60 |
| 7,102,132 B2 * | 9/2006 | Ludviksson | | C23C 14/54 250/339.13 |
| 8,005,562 B2 * | 8/2011 | Baek | | H01J 37/32935 438/710 |
| 8,101,906 B2 * | 1/2012 | Tallavarjula | | G01J 3/28 250/252.1 |
| 9,200,950 B2 * | 12/2015 | Lian | | G01J 1/42 |
| 9,295,148 B2 * | 3/2016 | Fong | | H01J 37/32091 |
| 2002/0029851 A1 * | 3/2002 | Edamura | | H01J 37/32935 156/345.12 |
| 2007/0118367 A1 * | 5/2007 | Dickson | | G10L 19/0204 704/221 |
| 2009/0090616 A1 * | 4/2009 | Du | | C23C 16/24 204/192.13 |
| 2013/0016344 A1 * | 1/2013 | Bullock | | H01J 37/32926 356/217 |
| 2013/0213573 A1 * | 8/2013 | Valcore, Jr. | | H03J 7/00 156/345.28 |
| 2013/0214683 A1 * | 8/2013 | Valcore, Jr. | | H01J 37/32082 315/111.21 |
| 2014/0107975 A1 * | 4/2014 | Manton | | G01D 3/10 702/179 |
| 2014/0265852 A1 * | 9/2014 | Valcore, Jr. | | H01J 37/32082 315/111.21 |
| 2015/0241272 A1 * | 8/2015 | Lian | | G01J 1/42 250/206 |
| 2015/0382442 A1 * | 12/2015 | Mueller | | H01J 37/32155 315/111.21 |
| 2016/0064199 A1 * | 3/2016 | Valcore, Jr. | | H01J 37/32935 250/206 |

\* cited by examiner

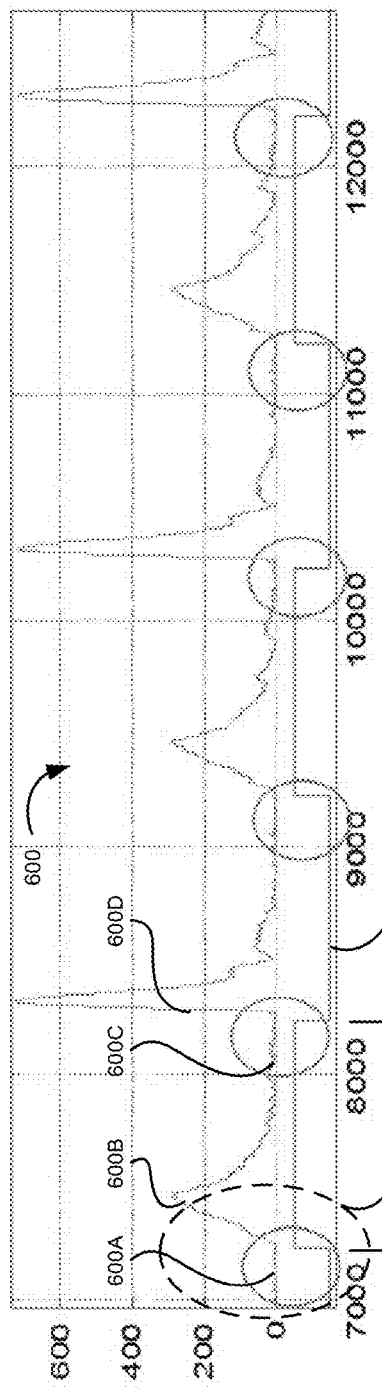
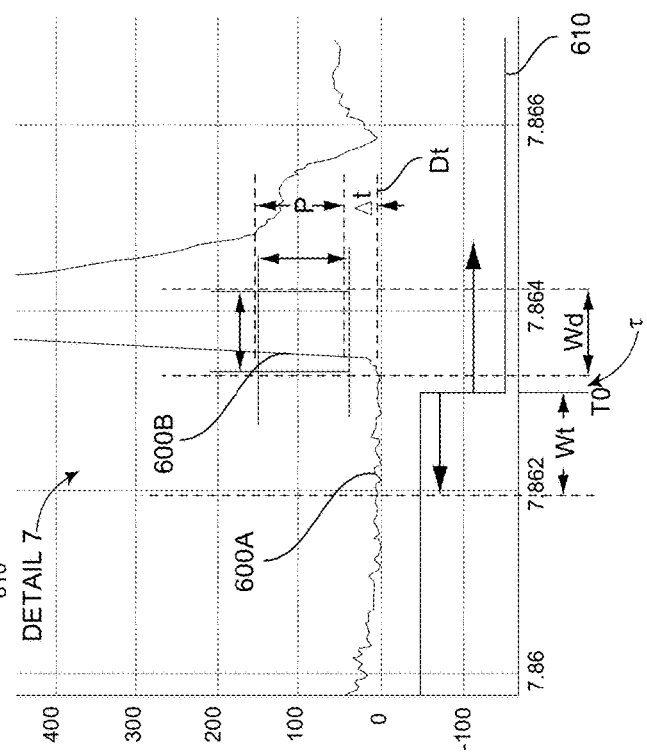
FIG. 6
FIG. 7

SYSTEM, METHOD AND APPARATUS FOR USING OPTICAL DATA TO MONITOR RF GENERATOR OPERATIONS

CROSS REFERENCE TO RELATED APPLICATIONS

This application claims priority from U.S. Provisional Patent Application No. 62/044,181 filed on Aug. 29, 2014 and entitled "System, Method And Apparatus For Using Optical Data To Monitor RF Generator Operations," which is incorporated herein by reference in its entirety for all purposes.

BACKGROUND

The present invention relates generally to plasma processing chambers and operations, and more particularly, to systems and methods for monitoring operations of the RF generator in a plasma processing system.

Plasma processing systems use RF signals from an RF generator to energize a plasma inside a plasma processing chamber. The RF signal can be modulated and pulsed to select and control many aspects of the plasma. Typically, the RF signal is monitored via a system of sampling the RF signal. Unfortunately, sampling the RF signal is not directly monitoring the effects of the RF signal on the plasma.

It is in this context that a need in the art arises.

SUMMARY

Broadly speaking, the present invention fills these needs by providing a system, method and apparatus for directly monitoring a plasma with an optical sensor to determine the operations of a pulsed RF signal. It should be appreciated that the present invention can be implemented in numerous ways, including as a process, an apparatus, a system, computer readable media, or a device. Several inventive embodiments of the present invention are described below.

One embodiment includes a plasma processing system including a plasma chamber. The plasma chamber includes an optical sensor directed toward a plasma region in the plasma chamber. An RF generator is coupled to the plasma chamber through a match circuit. An RF timing system is coupled to the RF generator. A system controller is coupled to the plasma chamber, the RF generator, the optical sensor, the RF timing system and the match circuit. The system controller includes a central processing unit, a memory system, a set of RF generator settings and an optical pulsed plasma analyzer. The optical pulsed plasma analyzer is coupled to the optical sensor and is capable of determining at least one of a timing of a change in state of an optical emission received in the optical sensor and/or a set of amplitude statistics corresponding to an amplitude of the optical emission received in the optical sensor.

Another embodiment provides a method of determining a change in state of an optical emission received in an optical sensor. The method includes receiving an optical plasma emission in an optical sensor, outputting an optical sensor signal, filtering the optical sensor signal to produce a filtered optical signal, rectifying the filtered optical sensor signal to produce a rectified, filtered optical sensor signal. A dynamic threshold level of the rectified, filtered, optical sensor signal is determined before a change in state of a timing reference signal. A change in state of the rectified, filtered optical sensor signal is detected as occurring after the change in state of the timing reference signal. The detected change in state of the rectified, filtered optical sensor signal is recorded.

Still another embodiment provides a method of determining an amplitude statistics corresponding to an amplitude of the optical emission received in the optical sensor. The method includes receiving an optical plasma emission in an optical sensor, outputting an optical sensor signal, subdividing at least one phase of a timing reference signal into a plurality of subdivisions. An amplitude statistic of the output optical sensor signal for each of the subdivisions is determined and the amplitude statistic of the output optical sensor signal for each of the subdivisions is stored.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIG. 6 is a more detailed view of a filtered and rectified optical sensor signal and the corresponding RF trigger signal, for implementing embodiments of the present disclosure.

FIG. 7 is a view of a Detail 7 portion of the filtered and rectified signal, for implementing embodiments of the present disclosure.

DETAILED DESCRIPTION

The plasma emits light of various wavelengths. The emitted wavelengths vary in intensity with various operational parameters such as pressure, RF signal power, presence of various plasma by products and constituent gases and many more parameters. What is needed is a system and method for directly monitoring a plasma with an optical sensor to determine the operations of a pulsed RF signal.

Several exemplary embodiments for optically monitoring RF generator operations will now be described. It will be apparent to those skilled in the art that the present invention may be practiced without some or all of the specific details set forth herein.

Many plasma processing systems such as etch, deposition or other plasma processing systems utilize a pulsed RF signal to energize the plasma. The pulsed RF can cause transient variations in the wavelengths of light emitted by the plasma as the RF is pulsed in an on or high power state and an off or low power state. The typical optical sensor systems are unable to differentiate between the transient variations in the wavelengths of light emitted by the plasma due to pulsed RF signals and other variations in the wavelengths of light emitted by the plasma due variations in the plasma operational parameters of pressure, constituent gases, concentrations of various plasma byproducts, temperature and other plasma operational parameters. As a result, the transient variations in the wavelengths of light emitted by the plasma caused by the pulsed RF signal make it difficult for typical optical sensor systems to be able to accurately monitor the plasma operations. The embodiments described herein provide a system and method that enables accurate monitoring of plasma operations, such as those that utilize pulsed RF power.

Figure 1A:
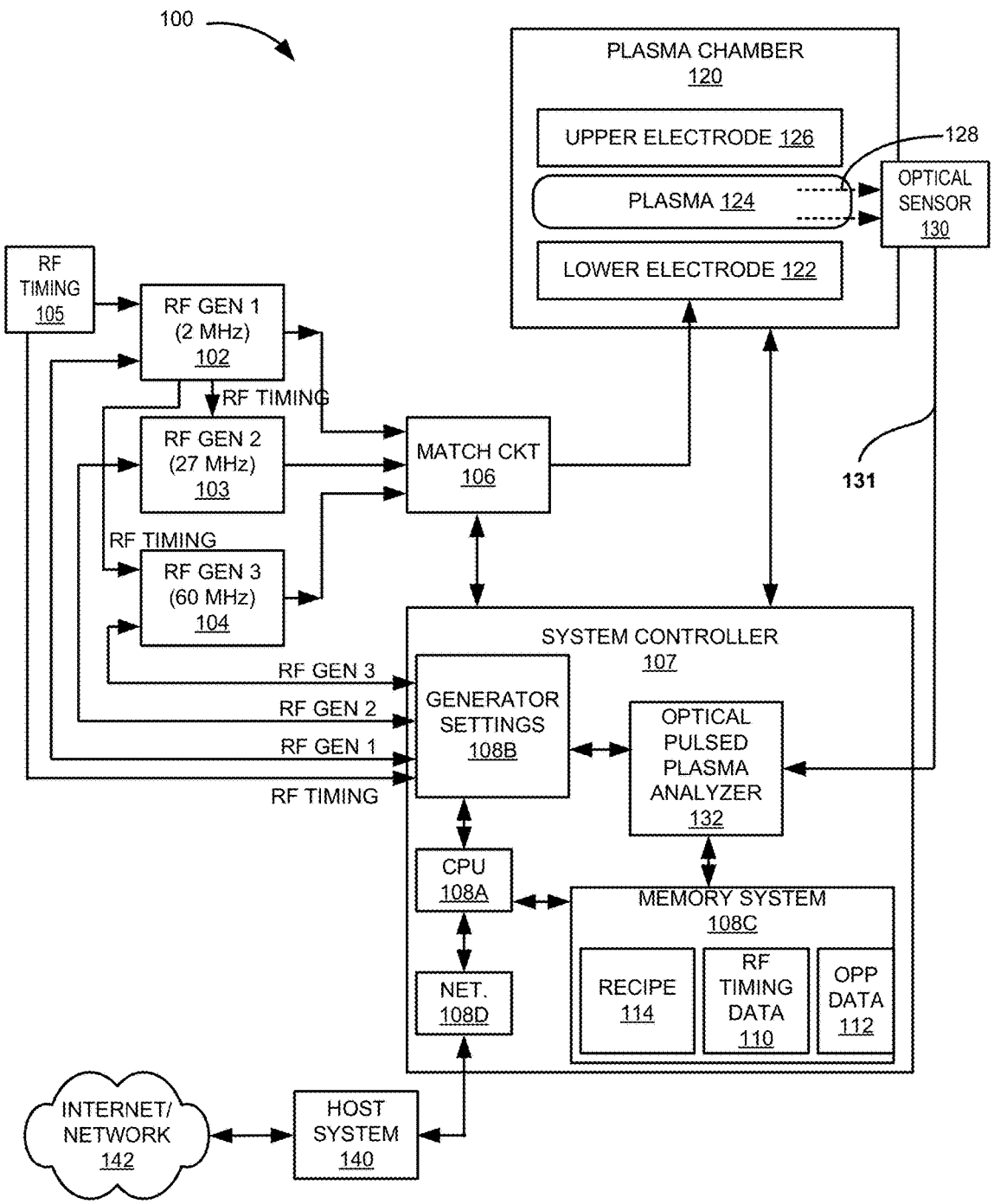
FIG. 1A is simplified schematic diagram of a plasma processing system, for implementing embodiments of the present disclosure.

FIG. 1A is simplified schematic diagram of a plasma processing system 100, for implementing embodiments of the present disclosure. The plasma processing system 100 includes one or more RF generators 102-104 having their respective RF outputs coupled to RF inputs of a match circuit 106. The match circuit 106 has an output coupled to a lower electrode 122 or an upper electrode 126 in a plasma chamber 120. As shown the match circuit 106 has the output coupled to the lower electrode 122 and the upper electrode 126 can be coupled to another potential (DC voltage or ground) or another RF signal source (not shown). A plasma 124 can be formed in a plasma region defined between the upper electrode 126 and the lower electrode 122. The plasma chamber 120 also includes an optical sensor 130 directed toward the plasma region to detect wavelengths of light 128 emitted from the plasma 124.

The plasma processing system 100 also includes a system controller 107. The system controller 107 includes a central processing unit 108A. The central processing unit 108A is coupled to a set of RF generator settings 108B, a memory system 108C and a network interface 108D. The network interface 108D couples the system controller 107 to a host system 140 and/or a network such as the Internet 142. The host systems allow a user to monitor and control the plasma processing system 100 remotely from the system controller 107. The system controller 107 is also coupled to each of the RF generators 102-104, the match circuit 106 and the plasma chamber 120 for controlling and monitoring the various operations of the plasma processing system 100.

The generator settings 108B include settings for various operational parameters for the RF generators 102-104. The generator settings 108B outputs generator control signals and receives feedback signals from the RF generators 102-104.

A timing signal system 105 is coupled to the RF generators 102-104 and the system controller 107. The timing signal system 105 outputs a RF trigger signal to the RF generators 102-104 and the system controller 107 to synchronize operations within the RF generators and the system controller.

The system controller 107 also includes an optical pulsed plasma analyzer 132. The optical pulsed plasma analyzer 132 processes the raw optical sensor signal 131 received from the optical sensor 130, as will be described in more detail below.

Additional operations and configuration details of the plasma processing system 100 are described in co-pending, co-owned U.S. patent application Ser. No. 13/620,386, filed on Sep. 14, 2012 and entitled "STATE-BASED ADJUSTMENT OF POWER AND FREQUENCY," which is incorporated by reference herein in its entirety for all purposes. Additional operations and configuration details of the plasma processing system 100 are also described in co-pending, co-owned U.S. patent application Ser. No. 13/666,912, filed on Nov. 1, 2012 and entitled "IMPEDANCE-BASED ADJUSTMENT OF POWER AND FREQUENCY," which is incorporated by reference herein in its entirety for all purposes.

One implementation provides a system and a method for using a given set of input signals received from the optical plasma emission 128 detected by optical sensor 130 and a pulse sync signal from the RF trigger signal to determine a state specific pulse width and pulse amplitude, relative to a given set point, where the definition of RF pulsing being defined as RF Pwr State 1>=RF Pwr State 0. The RF trigger signal can be used to aid in extracting timing information from the optical sensor 130. The RF trigger signal may or may not be used to derive timing information about the plasma processing system 100.

A first implementation evaluates amplitude and a second implementation evaluates timing. The amplitude statistics may be computed directly using data from the optical sensor 130. The computation for amplitude data may or may not utilize a histogram. Amplitude analysis may be characterized by lightweight, rapid computations, and fast upload rates. Smaller data capture windows can be used in order that other aspects of the larger system may record/observe/react quickly to any fast transients. The overall throughput rate can be in the range of >=10 MSPS, such that for a window size of 10 ms (100 Kpts), the pulse width statistics are available to be passed to the host system 140 at a rate of about 100 Hz, without any stale data. Similarly, for a 100 ms window size (1 Mpts), the pulse width statistics can be passed to the host system 140 at a rate of about 10 Hz.

Figure 1B:
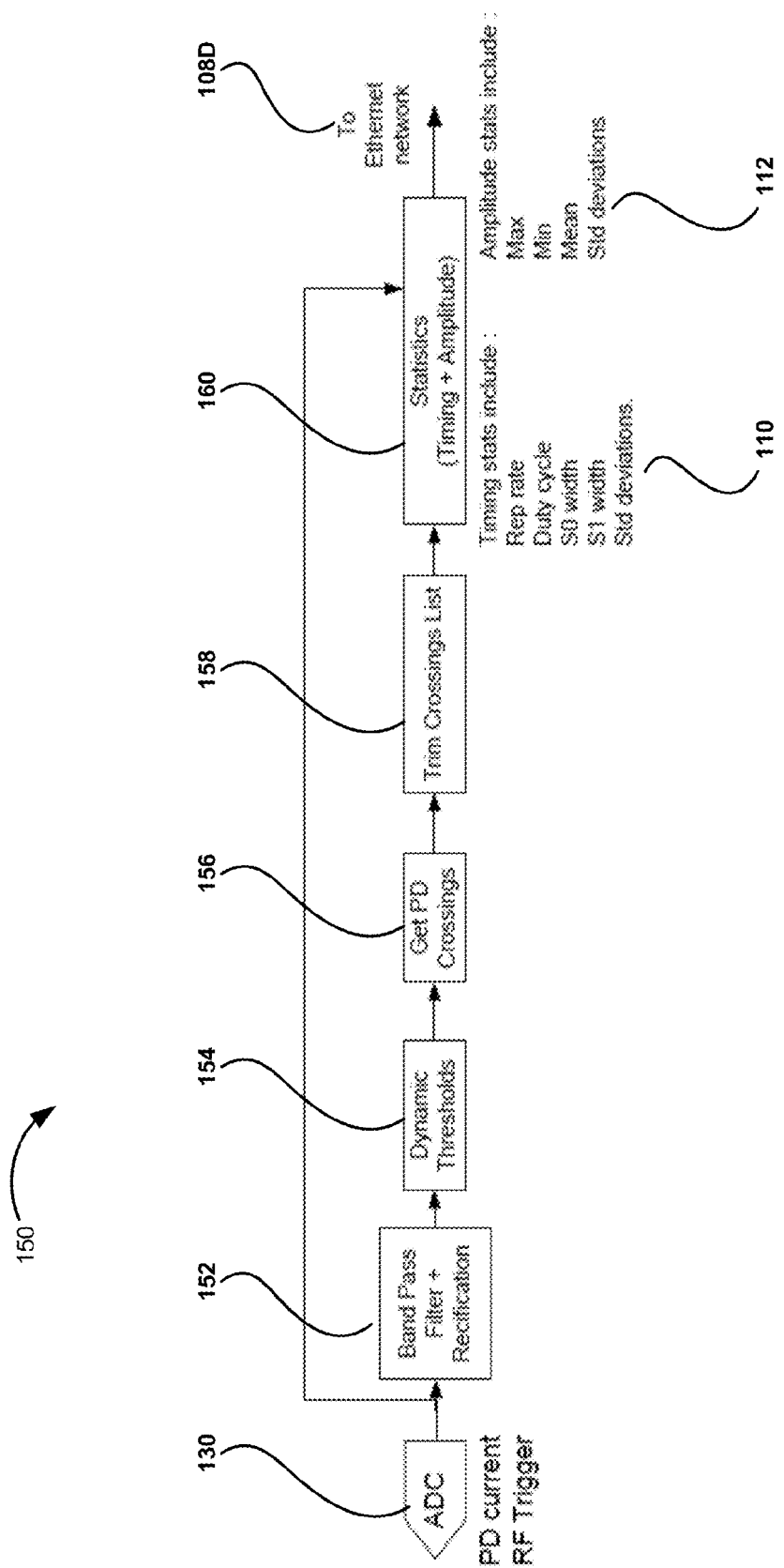
FIG. 1B is a simplified schematic diagram of a timing information extraction system, for implementing embodiments of the present disclosure.

FIG. 1B is a simplified schematic diagram of a timing information extraction system 150, for implementing embodiments of the present disclosure. The timing information extraction system 150 can be included in the optical pulsed plasma analyzer 132. The timing information extraction system 150 uses the optical plasma emission 128 from the optical sensor 130. The accuracy of the timing information extraction system 150 is improved when many cycles are recorded. As a result, longer record lengths and slower update rates when compared to the first implementation of compiling and reporting amplitude statistics, in exchange for more precise repetition rates and duty cycle statistics. The timing information extraction system 150 includes a bandpass filter/rectifier 152 followed by a dynamic threshold detector 154 to obtain a pulse crossing information 156. The crossing information is then processed 158 to obtain the desired timing statistics 160.

Figure 1C:
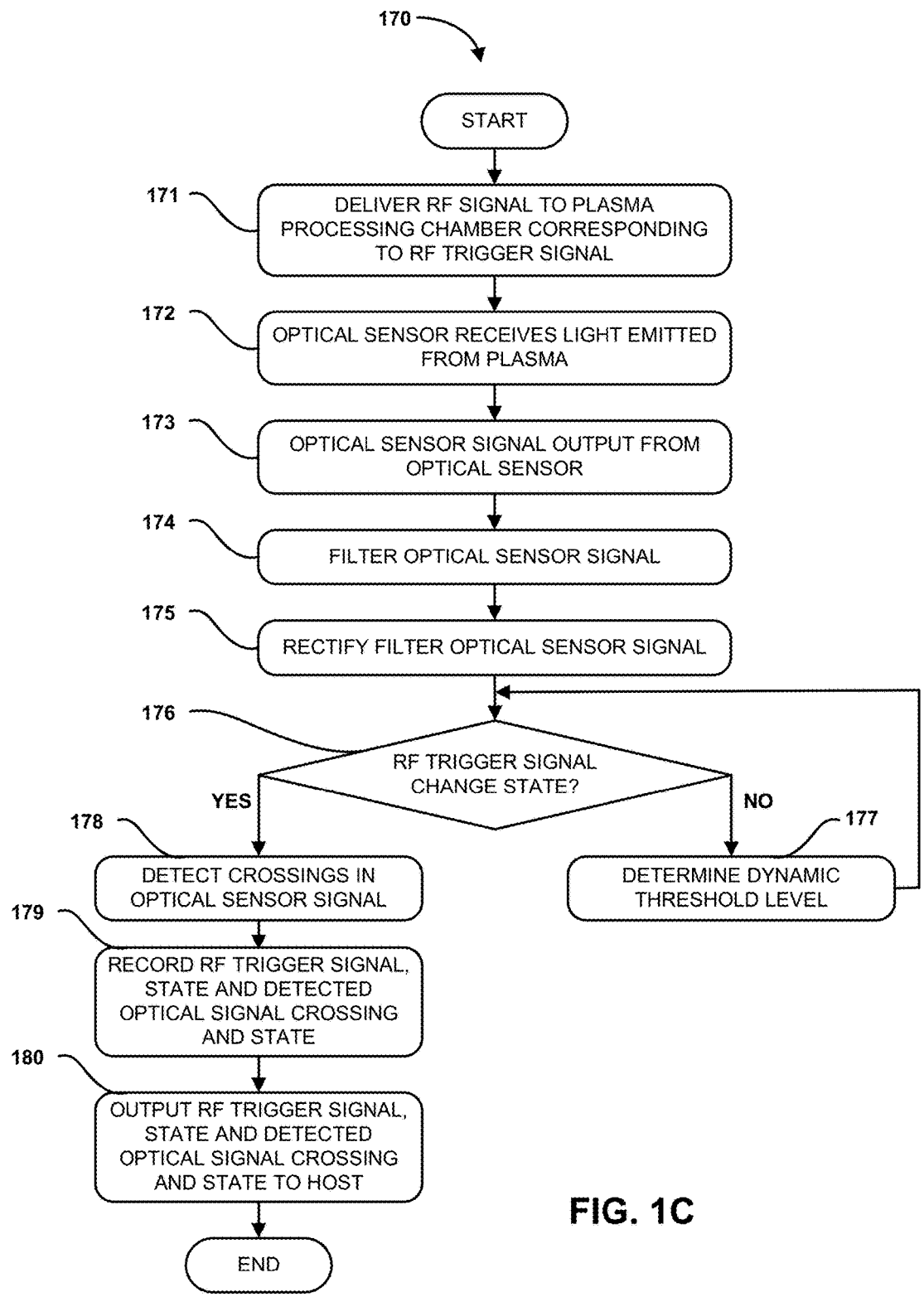
FIG. 1C is a flowchart diagram that illustrates the method operations performed in optical pulsed plasma analyzer for timing information extraction, for implementing embodiments of the present disclosure.

FIG. 1C is a flowchart diagram that illustrates the method operations 170 performed in optical pulsed plasma analyzer 132 for timing information extraction, for implementing embodiments of the present disclosure. In an operation 171, at least one of the RF generators 102-104 outputs an RF signal to the plasma chamber 120 corresponding to an RF trigger signal received in the RF generators and according to the setting included in the corresponding generator settings 108B.

In an operation 172, the optical sensor 130 detects an optical plasma emission 128 emitted from the plasma 124. In an operation 172, the output data from the optical sensor 130 is sent to the band pass filter 152, which removes DC components and provides spectral shaping in an operation 174. In an operation 175, after the band pass filter 152, the signal is rectified, and any negative data values (after filtering) are inverted to be positive. The rectified signal is sent to the dynamic threshold detector 154 which performs the timing extraction.

In an operation 176, the RF trigger signal is examined. If the RF trigger signal has changed states since the previously detected time the RF trigger signal changed states, then the method operations continue in an operation 178 as described below. If the RF trigger signal has not changed states since the previously detected time the RF trigger signal changed states, then the method operations continue in an operation 177. In an operation 177, the dynamic threshold level is determined.

Before the RF trigger signal state change occurs, the dynamic threshold detector 154 performs a moving average function of the detected optical plasma emission 128. This moving average function identifies an accurate baseline noise level of the detected optical plasma emission 128. The baseline noise level of the detected optical plasma emission 128 can then be used as a reference for a selected threshold level offset from the baseline noise level.

In operation 178, after a RF trigger signal state change occurs, the crossings detector 156 analyzes the detected optical plasma emission 128 to identify a significant dV/dt such as a sufficiently steep slope in the detected optical signal, as will be described in more detail below. The significant dV/dt indicates the RF signal state change has occurred in plasma processing chamber. The identified RF signal state change is designated a crossing or a change in states. The time and the state of the crossing, either up or down, for both the signal from the optical sensor 130 and the RF timing signal are recorded in the respective optical pulsed plasma data table 112 and RF timing data table 110 in the memory system 108C, in an operation 179. The optical pulsed plasma data table 112 can be used as an RF signal crossings list. The RF signals crossing list may be further pruned as needed, and statistics are derived from the pruned crossings list. In an operation 180, the optical pulsed plasma data table 112 and RF timing data table 110 can be output to the host system 140 and the method operations can end.

Figure 2:
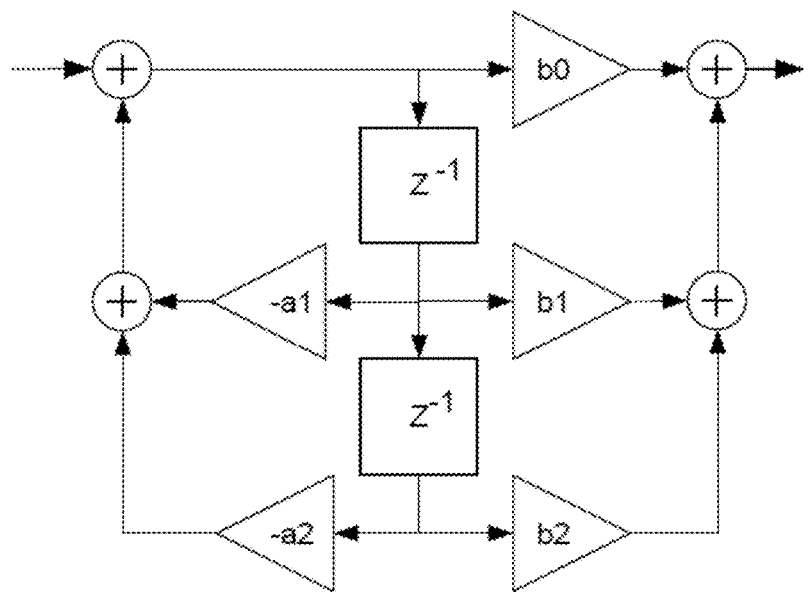
FIG. 2 is a simplified schematic diagram of the band pass filter, for implementing embodiments of the present disclosure.
Figure 3:
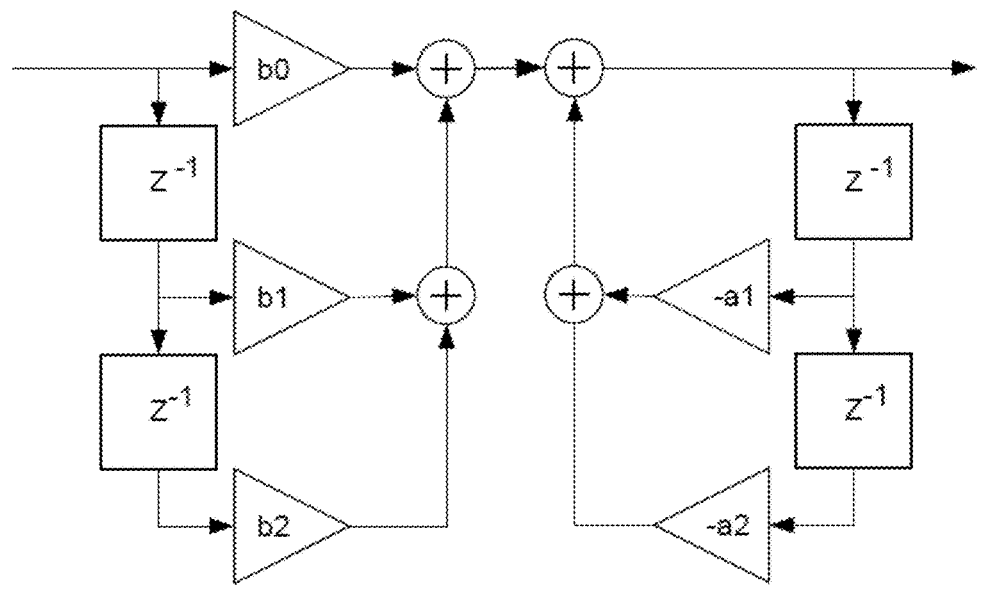
FIG. 3 is a simplified schematic diagram of an alternate band pass filter, for implementing embodiments of the present disclosure.

The band pass filter 152 can be a 2nd order infinite impulse response filter using a Butterworth (e.g., a maximally flat in the pass-band) criteria. FIG. 2 is a simplified schematic diagram of the band pass filter 152, for implementing embodiments of the present disclosure. The band pass filter 152 can be a direct form type II structure using double precision floating point coefficients. FIG. 3 is a simplified schematic diagram of an alternate band pass filter 152', for implementing embodiments of the present disclosure. The alternate band pass filter 152' can be a direct form type I structure having a separate feed forward and feedback paths, with the feed-forward structure feeding the feedback structure, which helps to prevent noise and other issues occurring due to limited internal precision and possible small number effects, with scaled/quantized coefficients.

The cutoff frequencies for F0, and F1 are: 20 kHz, and 200 kHz respectively. The resulting coefficient values are shown in Table 1

TABLE 1

| a0 | 1 | b0 | −0.053576128941320 |
|---|---|---|---|
| a1 | −1.891351811 | b1 | 0 |
| a2 | 0.892847742 | b2 | 0.053576128941320 |

Figure 4A:
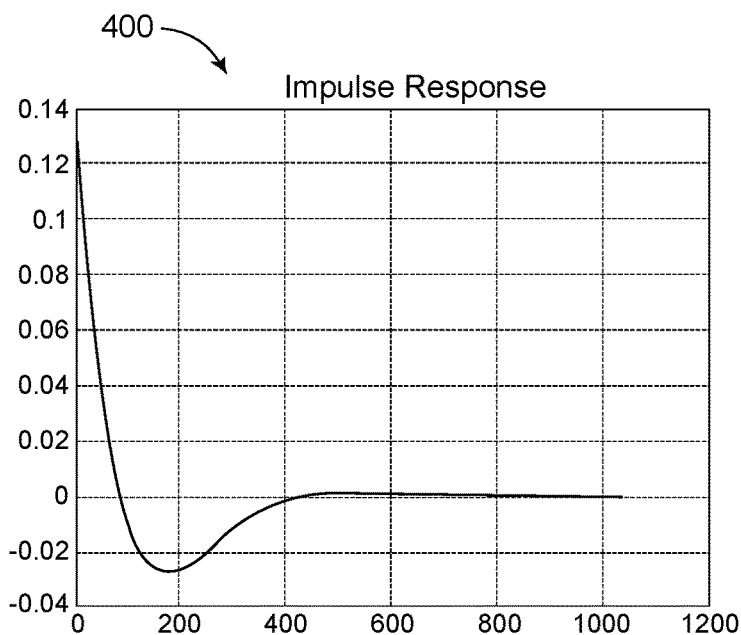
FIGS. 4A-D are graphs of a typical filter response, for implementing embodiments of the present disclosure.
Figure 4B:
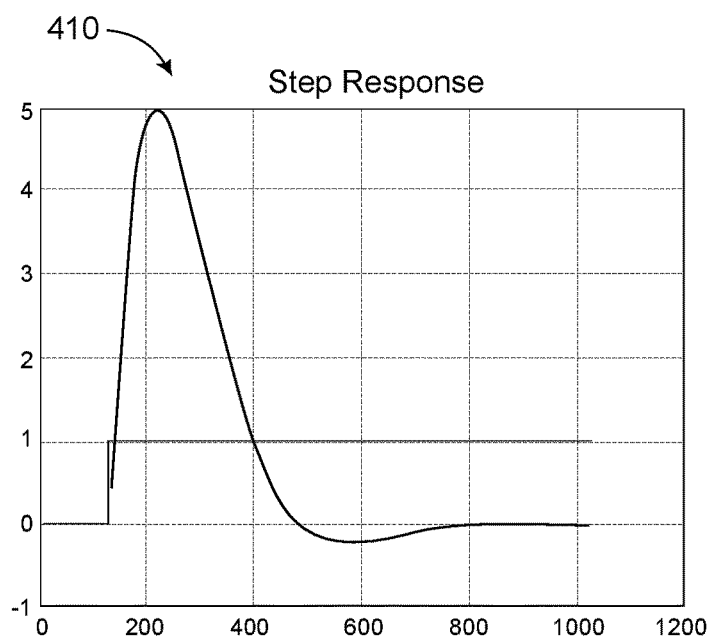
Figure 4C:
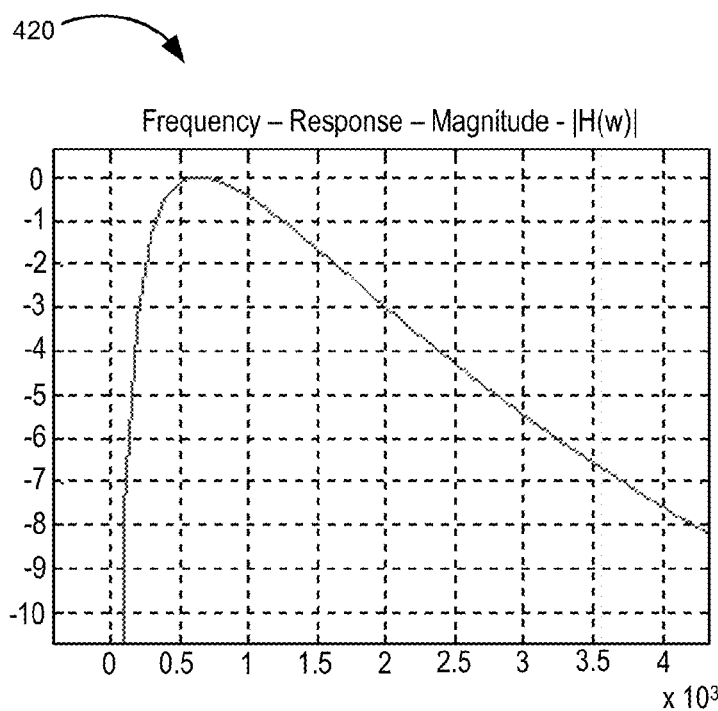
Figure 4D:
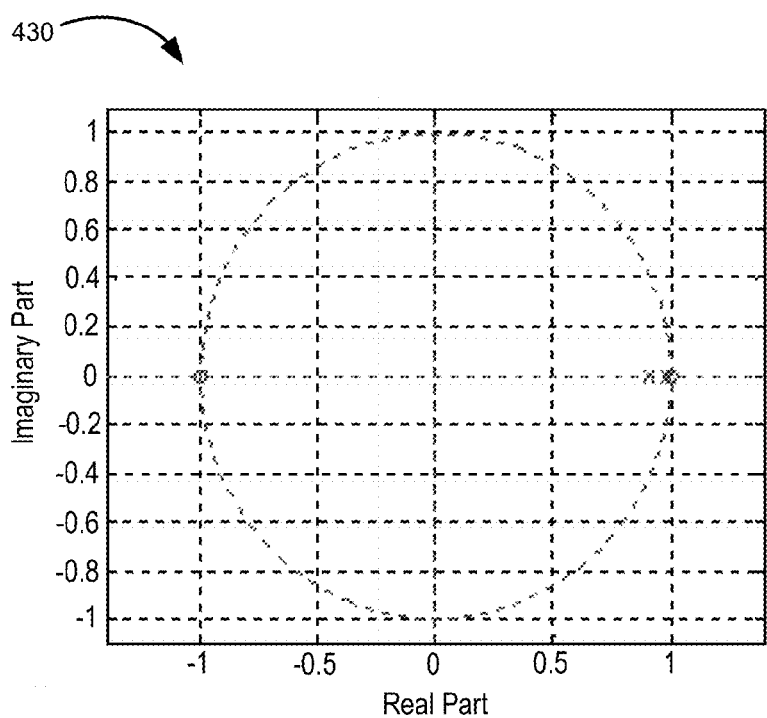

FIGS. 4A-D are graphs of a typical filter response, for implementing embodiments of the present disclosure. FIGS. 4A and 4C are graph of an impulse response 400, 420 and FIGS. 4B and 4D are graphs of a step response 410, 430. The graphs 400-430 include a normalized magnitude plot of the transfer function and a pole-zero plot for stability. Infinite impulse response filters may not provide a linear phase response, however input to output delay is minimized. After the band pass filter, but before rectification, there is 0 DC offset to the signal.

Figure 5A:
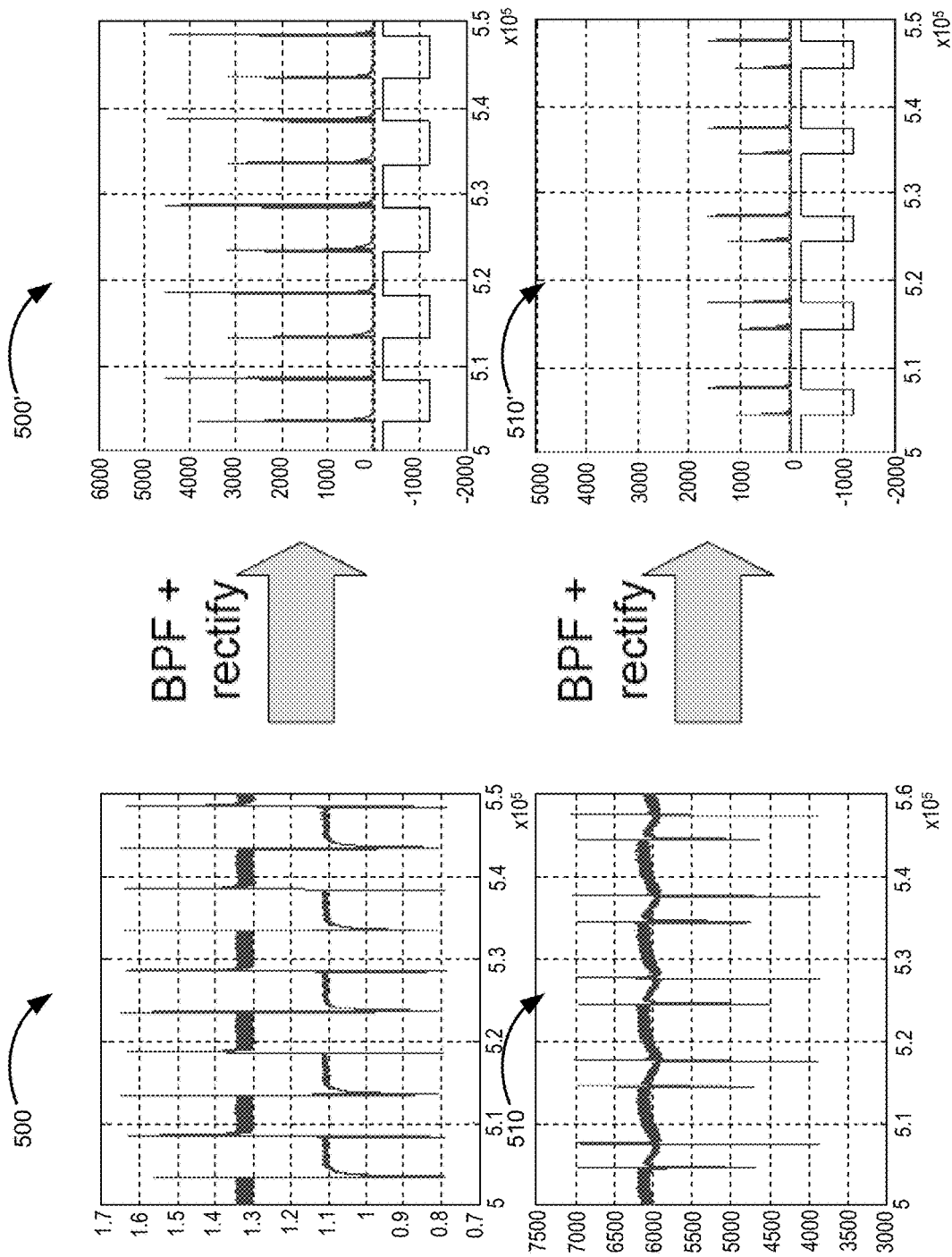
FIG. 5A is a graph of two signals before and after band-pass filtering, for implementing embodiments of the present disclosure.

After filtering, the filtered optical detector signal is rectified in a rectifier. Rectification converts the negative components of the filtered optical detector signal to positive components. As a result, after rectification, a DC level may be extracted. It is very similar to rectifiers used in envelope detectors for amplitude modulation. FIG. 5A is a graph of two signals before 500, 510 and after band-pass filtering 500', 510', respectively, for implementing embodiments of the present disclosure.

Figure 5B:
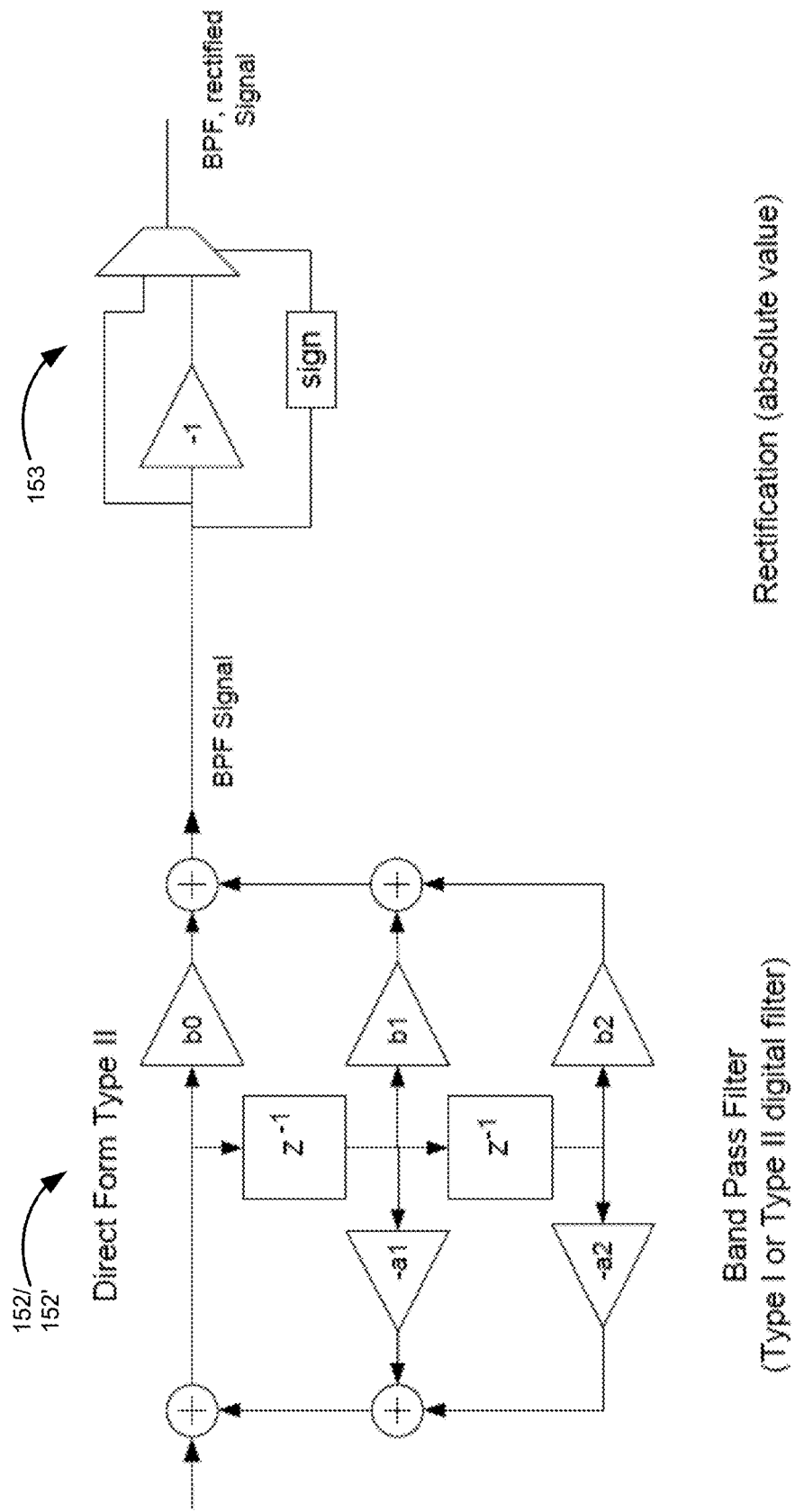
FIG. 5B is a simplified schematic of the band pass filter and a rectifier, for implementing embodiments of the present disclosure.

FIG. 5B is a simplified schematic of the band pass filter 152/152' and a rectifier 153, for implementing embodiments of the present disclosure. The filter coefficients (a0, a1, a2, b0, b1, b2) can be programmable by software, for flexibility, and possible future improvements. The infinite impulse response filter can be either a direct form type I or type II depending on which provides better (internal data overflow, saturation) characteristics. For hardware implementations of infinite impulse response filters, a MAC (multiply-accumulate) structure is can be utilized. However, sufficient bit widths on the coefficients are utilized, as well as sufficient overflow bit width on the accumulator to ensure both stability, and accuracy to the floating point implementation.

It is also possible to implement the infinite impulse response filter with floating point coefficients, but this may use a floating point multipliers and floating point adders. Floating point operations tend to utilize more extensive circuitry than a corresponding fixed point operations circuitry.

Figure 5C:
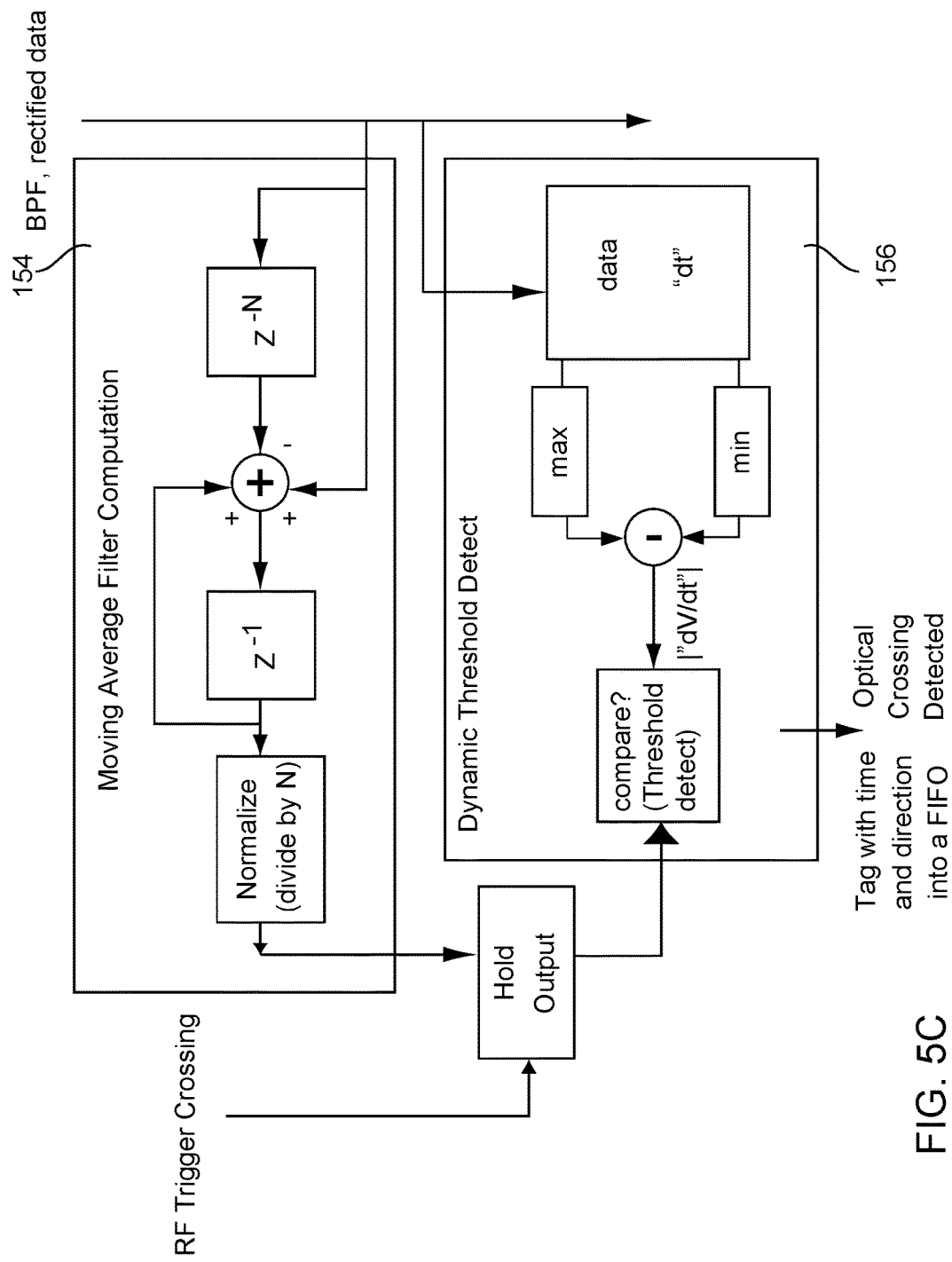
FIG. 5C is a simplified schematic of the dynamic threshold detector and the crossings detector, for implementing embodiments of the present disclosure.

FIG. 5C is a simplified schematic of the dynamic threshold detector 154 and the crossings detector 156, for implementing embodiments of the present disclosure. The moving average length may be programmable by software. Memory efficient values can be powers of 2 (e.g., 8, 16, 32, 64), and using powers of 2 can simplify the division down to a simple shift right operation. A scaling factor and a minimum output level (not shown) between the output of the moving average and the hold function. The scaling factor and the minimum output level can be user selectable or under software control.

In the dynamic threshold detector 154 the minimum and maximum functions can operate at relatively high speed. One implementation keeps a running minimum and a running maximum can work well by breaking up the data into blocks. For streaming data, a running minimum or maximum for the last N samples, can track new data coming in, and old data dropping off, alternatively or additionally, streaming data can run through the last N samples for every new data element coming in (and data dropping off).

Figures 5D, 5E:
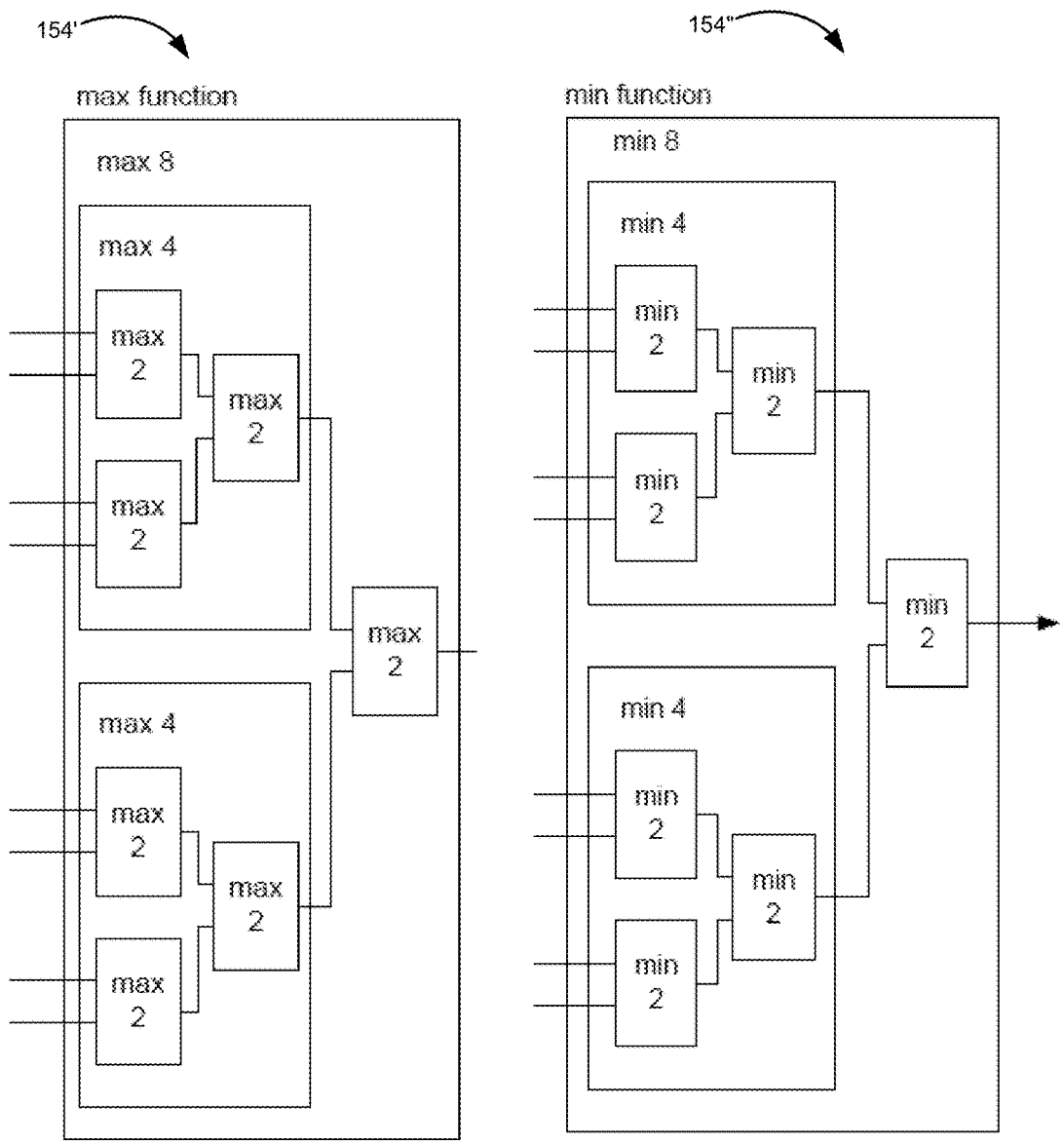
FIGS. 5D and 5E illustrate a simplified schematic diagram of a parallel minimum calculator and maximum calculator, for implementing embodiments of the present disclosure.

FIGS. 5D and 5E illustrate a simplified schematic diagram of a parallel minimum calculator 154" and maximum calculator 154', for implementing embodiments of the present disclosure. The parallel minimum and maximum calculation avoids stale data dropping off which takes place across N data elements. Such a parallel minimum and maximum calculation can be implemented in hardware or software or combinations thereof. The parallel minimum and maximum calculation also provides for high performance throughput of new data every clock and may be expanded out in a hierarchical decomposition as shown.

The sample threshold window Wt size is configurable up to about 1 million points such as for a 10 Hz update rate, at 10 MSPS. Reducing the sample threshold window Wt duration can provide faster update rates with the same sample rate. Some example update rates include:

| Update rate | Window size | Memory (Data) Size | Max Outlier | Max # outliers |
| --- | --- | --- | --- | --- |
| 10 Hz | 1 MS | 2 Mbytes (1M x 2b) | 200 ms | 1/100K requests |
| 50 Hz | 200 KS | 400 Kbytes | 50 ms | 1/100K requests |
| 80 Hz | 125 KS | 250 Kbytes | 50 ms | 1/100K requests |
| 100 Hz | 100 KS | 200 Kbytes | 50 ms | 1/100K requests |
| 200 Hz | 50 KS | 100 Kbytes | 10 ms | 1/100K requests |

From an overall system perspective, if an OS layer is utilized, the system can be sufficiently responsive, including appropriate interrupt latency, etc., in order to support the fastest update rates described above.

FIG. 6 is a more detailed view of a filtered and rectified optical sensor signal 600 and the corresponding RF trigger signal 610, for implementing embodiments of the present disclosure. At a time T0, the RF trigger signal switches from a low state to a high state. Before time T0, the filtered and rectified optical sensor signal 600A has settled to a substantially stable level of about 0, as shown. This substantially stable level is identified as a dynamic threshold level Dt. The dynamic threshold level Dt is determined by a level generator that averages samples before at least one of a rising or a falling edge of the RF trigger signal such as the rising edge at time T0 and the falling edge at time T1 as will be described in more detail below.

At time T0, the RF trigger signal switches from a low state to a high state. The change in state of the RF trigger signal at time T0 causes a change in the RF signal applied to the plasma chamber 120 from at least one of the RF generators 102-104 and, eventually, a corresponding change in the optical plasma emission 128 detected by the optical sensor 130 and the corresponding change in the amplitude of the optical sensor signal output from the optical sensor, as shown in portion 600B of the filtered and rectified optical sensor signal 600.

At a time T1, the RF trigger signal switches from a high state to a low state. Before time T1, the filtered and rectified optical sensor signal 600C is settled to the dynamic threshold level Dt of about 0 as shown. The change in state of the RF trigger signal at time T1 causes a change in the RF signal applied to the plasma chamber 120 from at least one of the RF generators 102-104, and an eventual, corresponding change in the optical plasma emission 128 detected by the optical sensor and the corresponding change in amplitude of the signal from the optical sensor 130, as shown in portion 600D, of the filtered and rectified optical sensor signal 600.

After at least one of the rising or falling edge of the RF trigger signal, corresponding to time T0 and time T1, respectively, a level detector monitors the filtered and rectified optical sensor signal 600 for a substantial increase in signal level as will be described in more detail below.

After the initial change in amplitude of the filtered and rectified optical sensor signal 600 from the optical sensor 130, the amplitude of the signal from the optical sensor returns to the dynamic threshold level Dt as shown in portion 600C of the filtered and rectified optical sensor signal 600.

FIG. 7 is a view of a Detail 7 portion of the filtered and rectified optical sensor signal 600, for implementing embodiments of the present disclosure. The dynamic threshold detection window Wt is shown occurring before the RF trigger signal state transitions at time T0.

The dynamic threshold level Dt adapts and adjusts for state and therefore can substantially avoid falsely detected RF trigger signal state transitions, e.g., false positives, and similarly can substantially avoid missed RF trigger signal state transitions.

In one implementation, the dynamic threshold level detect analyzes at sets of up to about 2000 or more data points (e.g., a 9 kHz signal has 1800 changes in 100 ms) and could be implemented in either software or hardware. A hardware implementation could free up the software for higher performance. It should be understood that the dynamic threshold level detect can analyze more or fewer than 2000 points that can occur within a duration of a selected dynamic threshold detection window Wt and at a selected dynamic threshold detection sampling rate during the selected dynamic threshold detection window Wt.

Figure 8:
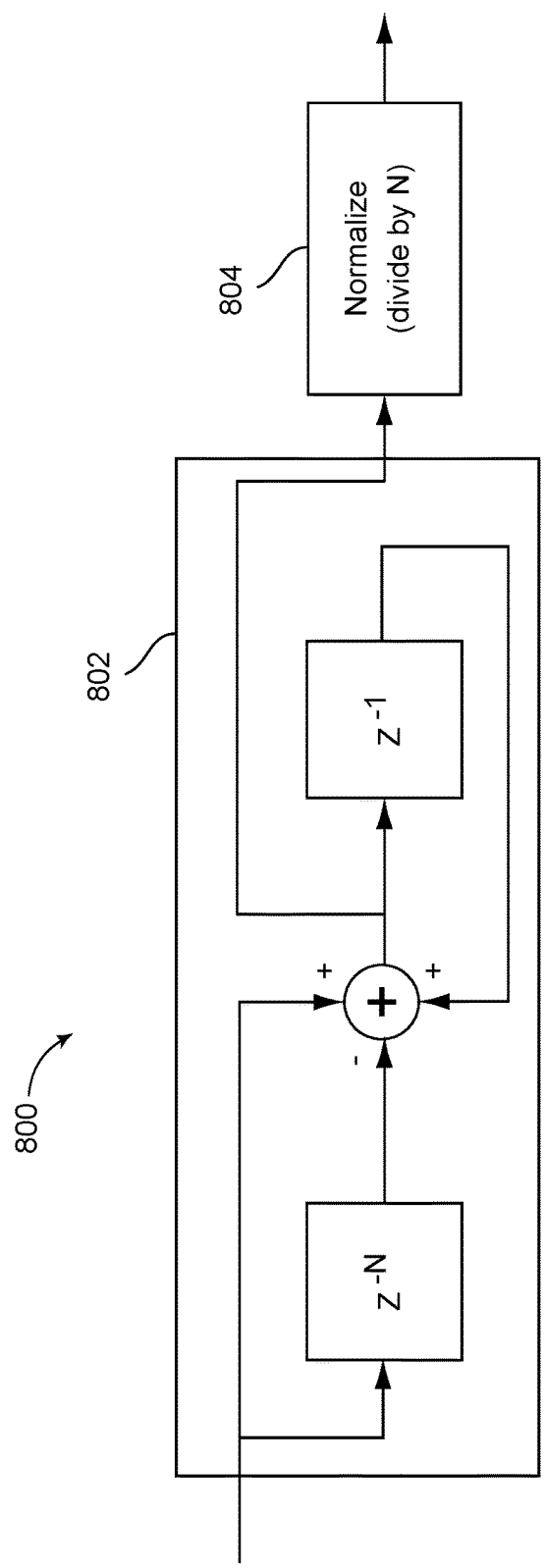
FIG. 8 is a simplified schematic of a dynamic threshold detection circuit, for implementing embodiments of the present disclosure.

FIG. 8 is a simplified schematic of a dynamic threshold detection circuit 800, for implementing embodiments of the present disclosure. The dynamic threshold detection circuit 800 includes a signal average device 802 and a normalizer device 804. It should be understood that the signal average device 802 and the normalizer device 804 may be implemented in hardware or software or combinations of hardware and software.

The signal average device 802 calculates a moving average of a selected number N of samples of the filtered and rectified optical sensor signal 600 from the optical sensor 130 in the selected threshold detection window Wt occurring before the change in state of the RF trigger signal, such as at time T0 and at time T1. The number N of data points (e.g., samples) analyzed and/or the duration of the dynamic threshold detection window Wt and/or a sampling rate within the dynamic threshold detection window Wt are user selectable options. By way of example, N can be a power of 2 (16, 32, 64, etc.). In one implementation, the signal average device 802 calculates the moving average by use of a box filter with a recursive structure. It should be noted that even though recursion is applied, the moving average is a finite impulse response mechanism and is inherently stable.

The normalizer device 804 can be optional in one or more implementations as the output of the signal average device 802 can be used or scaled as may be selected. Also note that if N is a power of 2, then the normalization step may become a binary shift right operation.

Referring again to FIG. 7, a group delay τ (tau) occurs after the change in state of the RF trigger signal at time t0. The group delay τ includes response delays in various control and RF circuits in the RF generators 102-104 and RF signal transfer delays caused by the time required for the RF signal to propagate through the RF transmission path from the RF generators to the plasma processing chamber 120. The group delay τ can also include additional system delays throughout the plasma processing system 100 and the optical sensor 130.

The group delay τ is determined by measuring the timing of the operations of the plasma processing system 100 and measuring the various delays between the change in state of the RF trigger signal and a corresponding change in state of the detected optical plasma emission 128. A selected number of changes in state of the RF trigger signal can be compared to the corresponding selected number of corresponding change in state of the detected optical plasma emission 128 to determine an average group delay τ value. In some implementations an additional delay may be added to the calculated average group delay. Once the group delay τ is determined, the same group delay τ is used for the timing extraction analysis.

After the group delay τ which immediately follows the change in state of the RF trigger signal at time T0, a change in amplitude of the optical sensor signal from the optical sensor 130 occurs, as shown in portion 600B of the filtered and rectified optical sensor signal 600. The change in amplitude of the optical sensor signal can be a change in the current or alternatively, the voltage, of the optical sensor signal corresponding to a change in intensity of selected wavelengths in the optical plasma emission 128.

After the group delay τ which immediately follows the change in state of the RF trigger signal at time T0, e.g., at a time T0+τ, a level detector begins monitoring the optical sensor signal for the duration of a selected time window Wd.

During the selected time window Wd the level detector is monitoring for a signal level in the filtered and rectified optical detector signal 600 that significantly exceeds the threshold level Dt found while calculating the moving average, as described above. A Δt offset threshold value is selected. The Δt offset threshold value sets a minimum difference or offset from the threshold level Dt for the filtered, rectified, optical sensor signal to be considered for a possible state change in the optical sensor signal. The Δt offset threshold value can be a selected constant value or alternatively can be a function of the threshold level Dt such as a multiplier of the threshold level.

Thus, at a time T0+τ, the level detector begins monitoring the filtered and rectified optical detector signal 600 for a value exceeding Dt+Δt.

A peak value P is selected as a minimum value that must be exceeded during the selected time window Wd to confirm a filtered and rectified optical sensor signal 600 for a value exceeding Dt+Δt is a true state change in the filtered and rectified optical sensor signal and not a noise or other spike. The width of the selected time window Wd determines a minimum slope required for a detected signal level of the rectified optical sensor signal 600 that exceeds Dt+Δt to be considered an true state change in the filtered and rectified optical detector sensor signal. The level detector can use a derivative function such as a dV/dt in the filtered and rectified optical sensor signal 600.

In one implementation, the level detector can remain in an inactive state after a change in state of the optical sensor signal is detected until a next change in state of the RF trigger signal is received. In this manner, no additional false positives are detected.

Timing statistics are gathered from the grouped/trimmed changes in RF state as detected by the optical sensor 130. The list of statistics is shown as follows:

Pulse Repetition Rate: <32 bit float> the average of all pulse repetition rates within the sample Pulse Duty Cycle: <32 bit float> the average of all the duty cycles within the sample set Pulse Width Average S1: <32 bit float> the average width of all S1 states (without inset adjustment) in the data set Pulse Width Max S1: <32 bit float> the maximum pulse width of all S1 states (without inset adjustment) in the data set Pulse Width Min S1: <32 bit float> the minimum pulse width of all S1 states (without inset adjustment) in the data set Pulse Width StdDev S1: <32 bit float> the standard deviation S1 state (without inset adjustment) in the data set Pulse Width Average S0: <32 bit float> the average width of all S0 states (without inset adjustment) in the data set Pulse Width Max S0: <32 bit float> the maximum pulse width of all S0 states (without inset adjustment) in the data set Pulse Width Min S0: <32 bit float> the minimum pulse width of all S0 states (without inset adjustment) in the data set Pulse Width StdDev S0: <32 bit float> the standard deviation S0 state (without inset adjustment) in the data set RF trigger signal Repetition Rate Average: <32 bit float>' include RF trigger signal S1 Width and RF trigger signal S0 width RF trigger signal Duty Cycle Average <32 bit float>

Tau RF timing signal vs BPF Rising Edge <32 bit float>' "inset value rising edge"

The repetition rate can be obtained within +/−0.1% of the RF trigger signal, as the system (plasma generator, and light detector) may not contain any frequency modulation terms.

Due to various rise times and fall times, the duty cycle will differ from the RF trigger signal as a function of the plasma response to different RF signals powers input to the plasma chamber 120. An adjustment of RF and other plasma operation parameter settings can have an impact on duty cycle calculations. In one implementation a duty cycle adjustment term can be introduced that can correct for duty cycle errors. The group delay τ occurs between the detected state changes in the optical sensor signal and the RF trigger signal state changes (for rising and falling edges). The group delay τ can be added to the rising edge and falling edge of the RF trigger signal changes when calculating duty cycle. This duty cycle adjustment may also be recorded in the memory system 108C and output to the host system 140 as a calculated statistic.

Amplitude Statistics

Figure 9A:
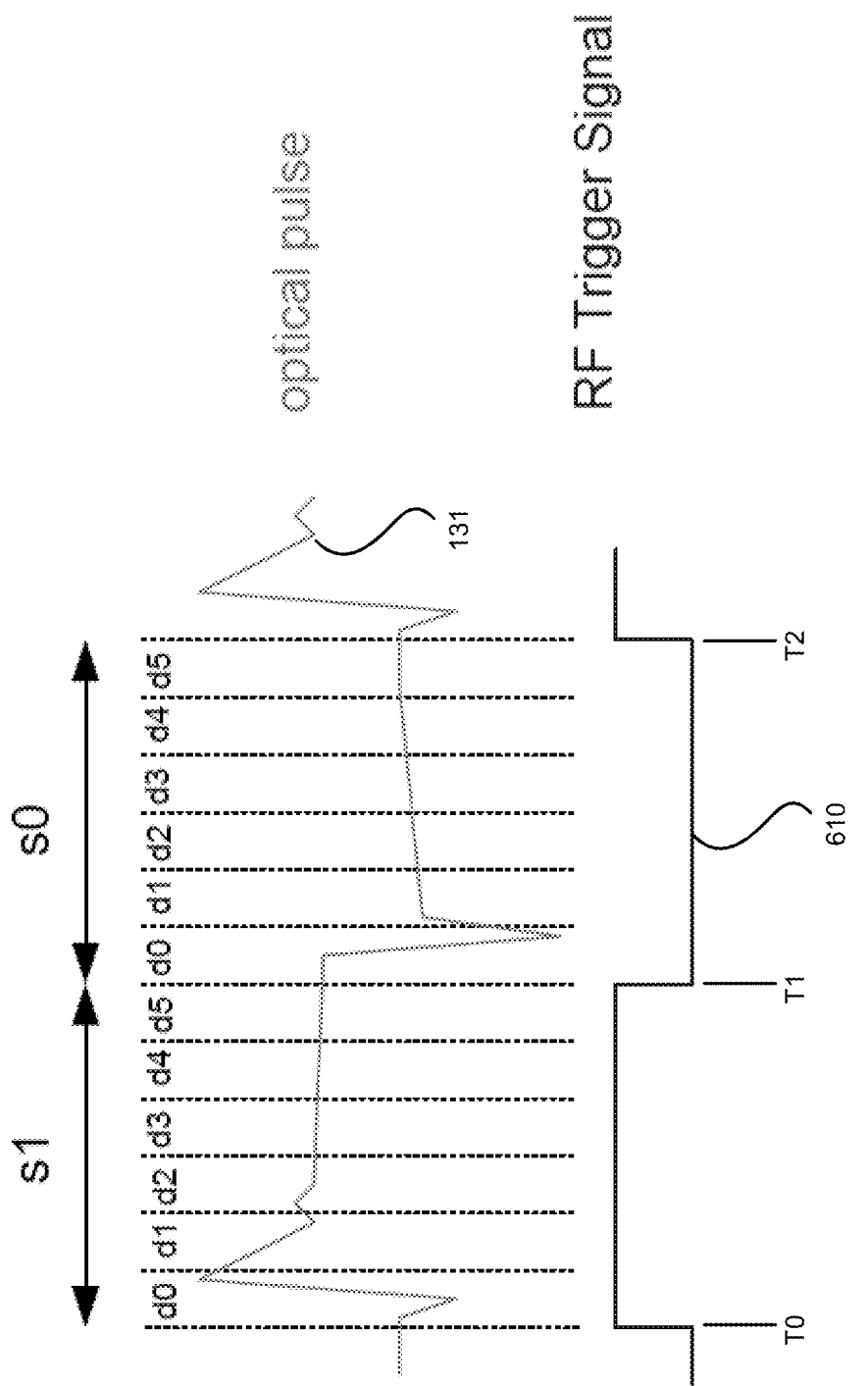
FIG. 9A is a diagram of a pulse window having 6 subdivisions for RF trigger signal phases S1 and S0, for implementing embodiments of the present disclosure.
Figure 9B:
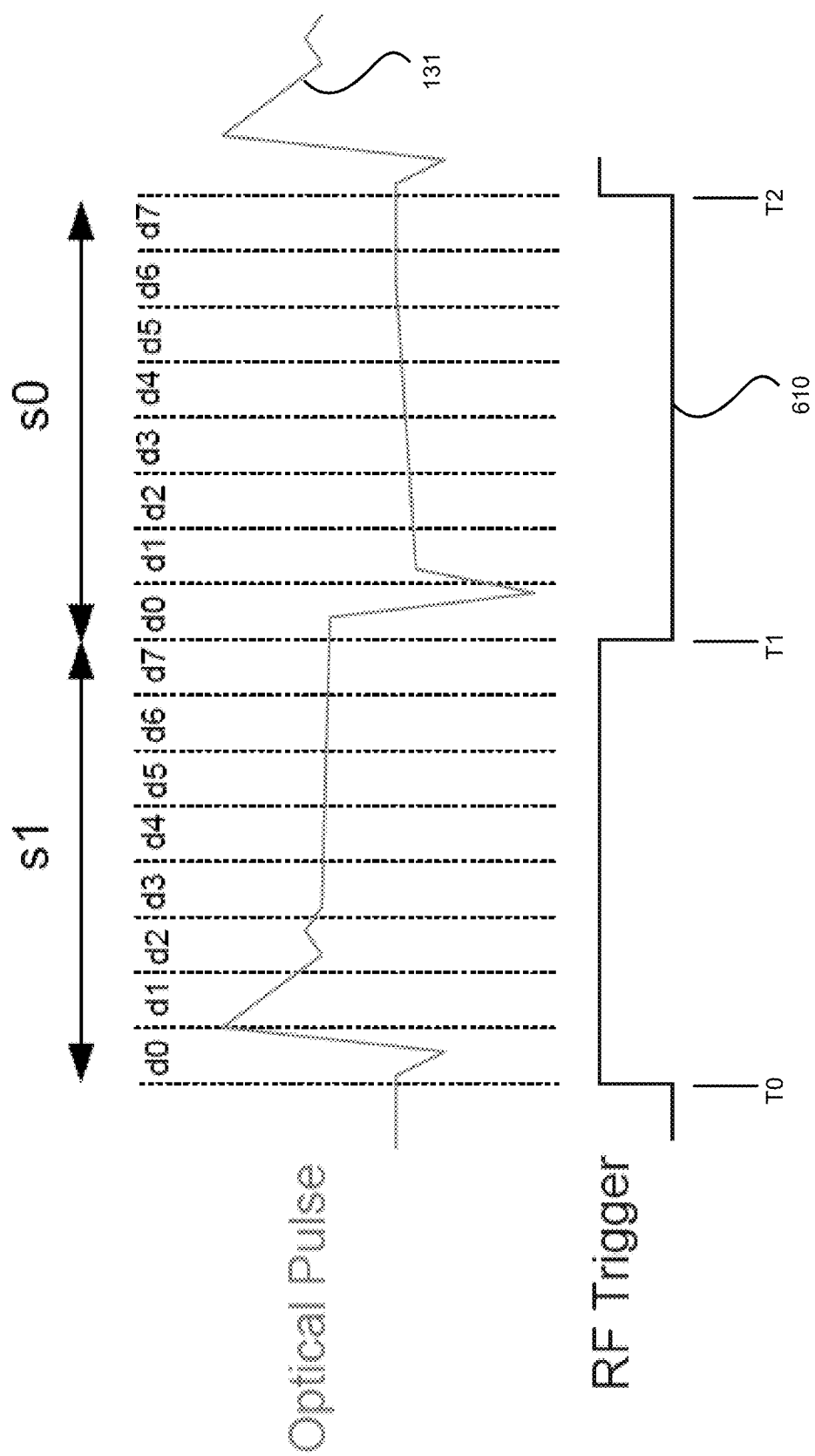
FIG. 9B is a diagram of a pulse window having 8 subdivisions for RF trigger signal phases S1 and S0, for implementing embodiments of the present disclosure.
Figure 10A:
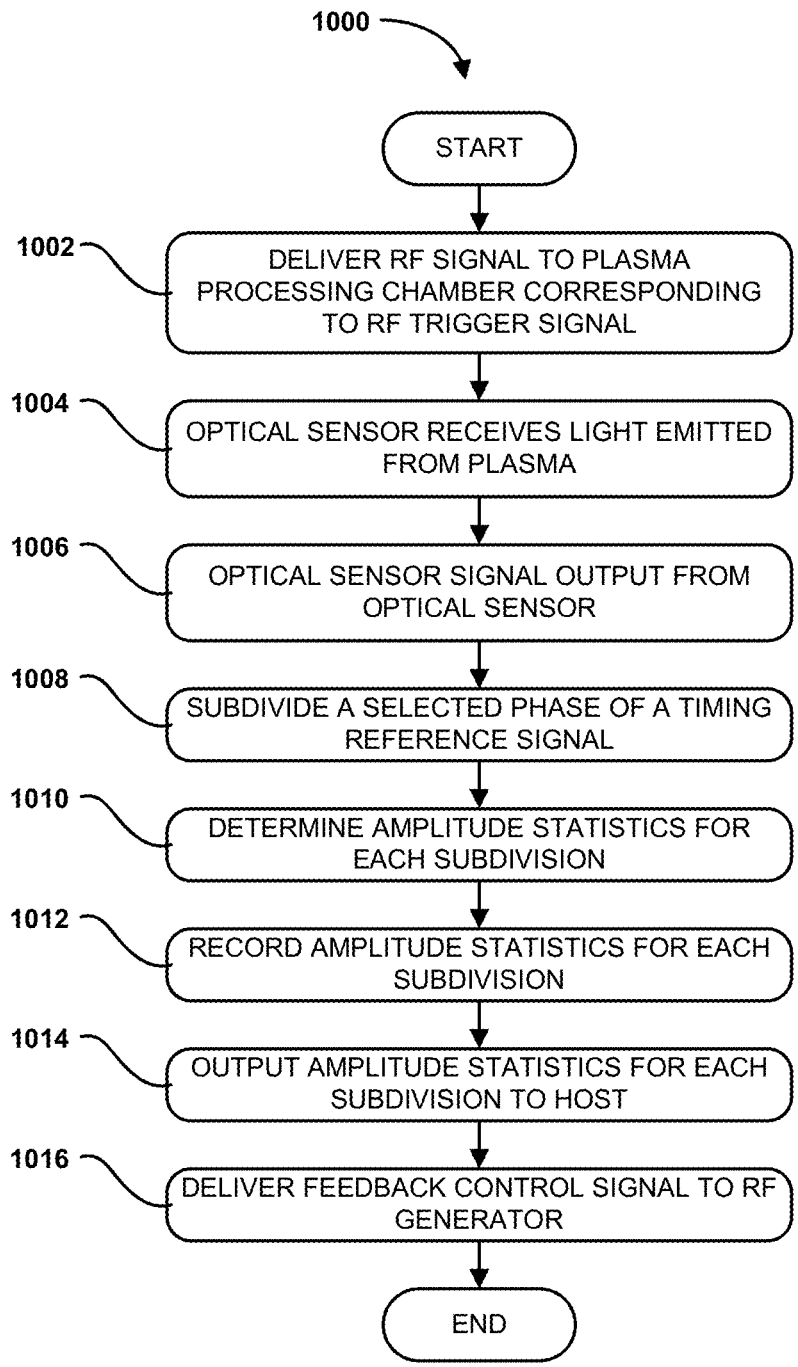
FIG. 10A is a flowchart diagram that illustrates the method operations performed in optical pulsed plasma analyzer for determining an amplitude statistics corresponding to an amplitude of the optical emission received in the optical sensor, for implementing embodiments of the present disclosure.

A second implementation can determine multiple pulse amplitude statistics in addition to or instead of the timing extraction system described above. Each phase of the RF timing signal is divided into a selected number of subdivisions. An amplitude statistic of the raw, unfiltered, optical sensor signal 131 is determined for each of the subdivisions of each phase of the RF trigger signal. FIG. 9A is a diagram of a pulse window having 6 subdivisions for RF trigger signal phases S1 and S0, for implementing embodiments of the present disclosure. FIG. 9B is a diagram of a pulse window having 8 subdivisions for RF trigger signal phases S1 and S0, for implementing embodiments of the present disclosure. FIG. 10A is a flowchart diagram that illustrates the method operations 1000 performed in optical pulsed plasma analyzer for determining an amplitude statistics corresponding to an amplitude of the optical emission received in the optical sensor, for implementing embodiments of the present disclosure.

In an operation 1002, at least one of the RF generators 102-104 outputs an RF signal to the plasma chamber 120 corresponding to an RF trigger signal received in the RF generators and according to the setting included in the corresponding generator settings 108B. In an operation 1004, the optical sensor 130 detects an optical plasma emission 128 emitted from the plasma 124. In an operation 1006, the optical sensor 130 outputs an optical sensor signal.

In an operation 1008, at least one phase of a timing reference signal such as the RF trigger signal is subdivided into a selected number of subdivisions. By way of example, as shown in FIG. 9A above, each of phases S1 and S0 are subdivided into 6 subdivisions. Similarly, as shown in FIG. 9B above, each of phases S1 and S0 are subdivided into 8 subdivisions. It should be noted that only one of phases S1, S0 may be subdivided and analyzed for amplitude statistical data. More than 8 or fewer than 6 subdivision as can be selected. The granularity of the resulting amplitude statistics data corresponds to the number of subdivisions of each phase. It should also be noted that each of the subdivisions can be equal or not equal in duration, however the selected duration of each of the subdivisions should be consistent across multiple cycles of the timing reference signal. By way of example, the subdivision d2 may not be equal in duration to subdivision d3, however, subdivision d2 should have the same duration in every phase S1 of the timing reference signal. Further, subdivision d3 should have the same duration in every phase S1 of the timing reference signal.

In an operation 1010, an amplitude statistics of the output optical sensor signal is determined for each of the subdivisions. The amplitude statistics of the output optical sensor signal is determined for each of the subdivisions includes a maximum value, a minimum vale and a mean value of the output optical sensor signal in each subdivision.

In an operation 1012, the amplitude statistics of the output optical sensor signal for each of the subdivisions is recorded such as in the memory system 108C of the system controller 107. In an operation 1014, the amplitude statistics of the output optical sensor signal for each of the subdivisions is output to the host system 140.

In an operation 1016, the host system 140 and/or the system controller 107 can compare the amplitude statistics of the output optical sensor signal for each of the subdivisions to a reference amplitude statistics and output a corresponding feedback signal to the plasma processing system 100.

The statistics can be limited to min/mean/max for the selected number of subdivisions for each phase of the RF trigger signal [1,2,4,6,8]. For a subdivision value of 1, the a single set of min/mean/max would be computed for all State 1 values within the configured window size, as well as a single set of min/mean/max values for State 0 (within same window). For a sub-division value greater than 1 (N), the width of a given state would be divided into N partitions, within the min/mean/max being returned for each partition, state specific, and constrained by the configurable window size.

Figure 10B:
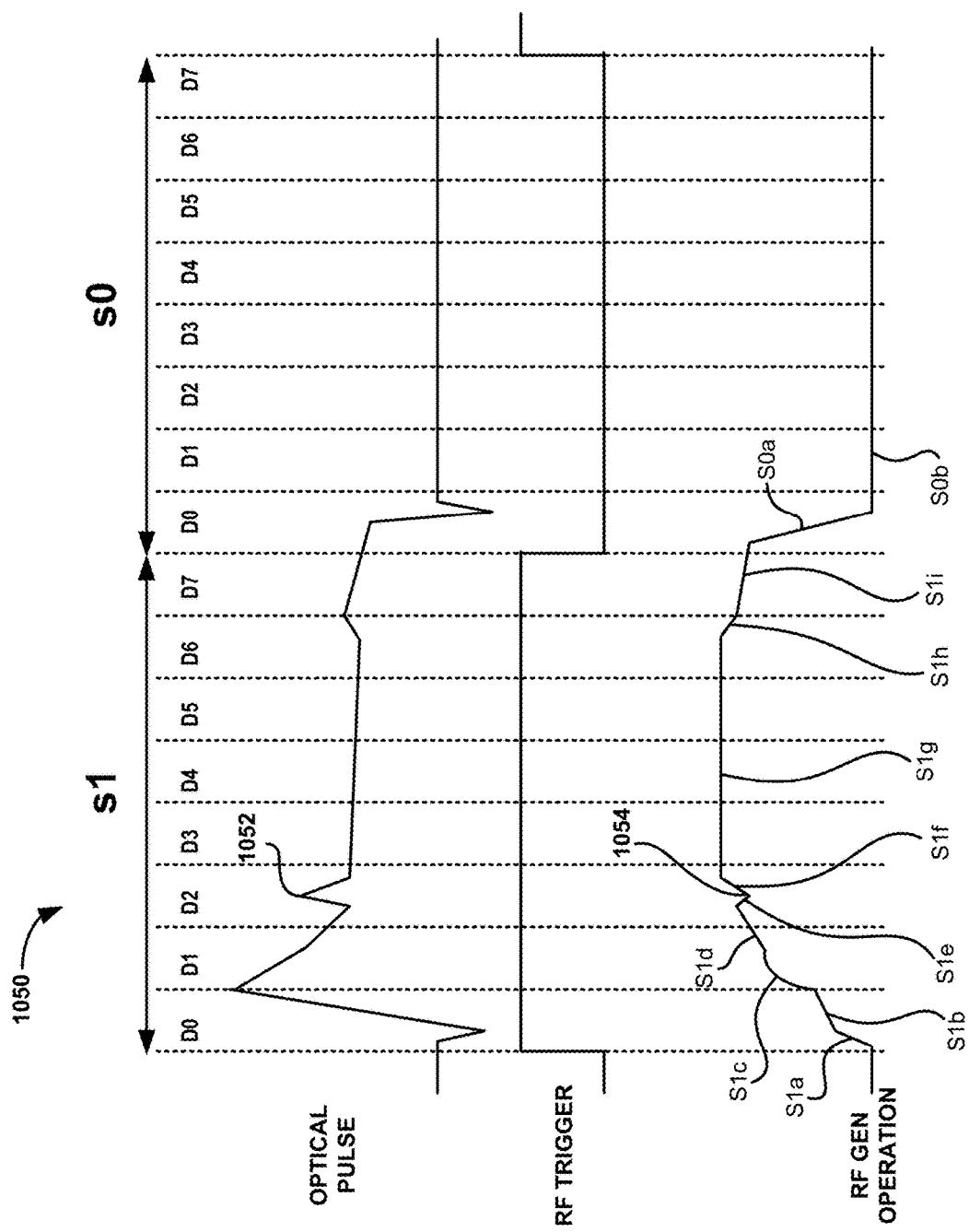
FIG. 10B is a diagram of a pulse window having 8 subdivisions for RF trigger signal phases S1 and S0 and the RF generator operation having multi-state operation during phase S1, for implementing embodiments of the present disclosure.

FIG. 10B is a diagram 1050 of a pulse window having 8 subdivisions for RF trigger signal phases S1 and S0 and the RF generator operation having multi-state operation during phase S1, for implementing embodiments of the present disclosure. Diagram 1050 includes the RF trigger pulse having phase S1 while the RF trigger is in a high state and phase S0 while the RF trigger is in a low state. The Phase S1 and S0 are subdivided into 8 subdivisions D0-D7 to allow the amplitude analysis of the optical pulse for each subdivision.

The RF generator changes to a high state to correspond to the phase S1 of the RF trigger pulse. Within the high state, the RF generator can include multiple states of operation. By way of example, when the RF generator is initially switched to a high state at the beginning of S1, the RF generator can initiate a power up operation during multi-state S1a. During the multi-state S1a, the RF generator has a predefined power up ramp or slope. This may be used for several reasons, by way of example, the selected ramp during multi-state S1a may allow the RF generator a more gradual power on phase that may increase the reliability of the RF generator and/or produce an RF output with fewer transients. After multi-state S1a, the RF generator sequentially progresses through multi-states S1b-S1i.

When the RF trigger switches to a low state at the beginning of phase S0, the RF generator switches to an S0a multi-state to control the power output as the power output is reduced from the high state S1 to the low state S0. The RF generator switches to multi-state S0b when the output signal of the RF generator reaches the low state. S0b is maintained until the next switch of the RF trigger pulse to state S1 and the sequence of multi-states S1a through S0b repeats. It should be noted that the multi-states illustrated are merely exemplary and any suitable curve or sloped line can be implemented during each multi-state S1a-S0b.

The amplitude statistical analysis of the optical pulse can also include the multi-states S1a-S0b and thus identify changes in the optical pulse that may be due to transitions from one multi-state of the RF generator to a subsequent multi-state. By way of example, a detailed amplitude analysis of the optical signal may indicate that the local peak 1052 is related to the RF generator multi-state transition from multi state S1e to multi-state S1f at point 1054.

Pulse Amplitude Statistics can include the following as examples:

Pulse Amplitude Average S1:
pulse_amp_avg_s1_d0 <uint_16> the average value during the S1 state in the d0 subdivision
pulse_amp_avg_s1_d1<uint_16> the average value during the S1 state in the d1 subdivision
pulse_amp_avg_s1_d2<uint_16> the average value during the S1 state in the d2 subdivision
pulse_amp_avg_s1_d3<uint_16> the average value during the S1 state in the d3 subdivision
pulse_amp_avg_s1_d4<uint_16> the average value during the S1 state in the d4 subdivision
pulse_amp_avg_s1_d5<uint_16> the average value during the S1 state in the d5 subdivision
pulse_amp_avg_s1_d6<uint_16> the average value during the S1 state in the d6 subdivision
pulse_amp_avg_s1_d7<uint_16> the average value during the S1 state in the d7 subdivision Pulse Amplitude Max S1:
pulse_amp_max_s1_d0<uint_16> the maximum value during the S1 state in the d0 subdivision
pulse_amp_max_s1_d1<uint_16> the maximum value during the S1 state in the d1 subdivision
pulse_amp_max_s1_d2<uint_16> the maximum value during the S1 state in the d2 subdivision
pulse_amp_max_s1_d3<uint_16> the maximum value during the S1 state in the d3 subdivision
pulse_amp_max_s1_d4<uint_16> the maximum value during the S1 state in the d4 subdivision
pulse_amp_max_s1_d5<uint_16> the maximum value during the S1 state in the d5 subdivision
pulse_amp_max_s1_d6<uint_16> the maximum value during the S1 state in the d6 subdivision
pulse_amp_max_s1_d7<uint_16> the maximum value during the S1 state in the d7 subdivision Pulse Amplitude Min S1 pulse_amp_max_s1_d0<uint_16> the minimum value during the S1 state in the d0 subdivision
pulse_amp_max_s1_d1<uint_16> the minimum value during the S1 state in the d1 subdivision
pulse_amp_max_s1_d2<uint_16> the minimum value during the S1 state in the d2 subdivision
pulse_amp_max_s1_d3<uint_16> the minimum value during the S1 state in the d3 subdivision
pulse_amp_max_s1_d4<uint_16> the minimum value during the S1 state in the d4 subdivision
pulse_amp_max_s1_d5<uint_16> the minimum value during the S1 state in the d5 subdivision
pulse_amp_max_s1_d6<uint_16> the minimum value during the S1 state in the d6 subdivision
pulse_amp_max_s1_d7<uint_16> the minimum value during the S1 state in the d7 subdivision Pulse Amplitude Average S0:
pulse_amp_avg_s0_d0<uint_16> the average value during the S0 state in the d0 subdivision
pulse_amp_avg_s0_d1<uint_16> the average value during the S0 state in the d1 subdivision
pulse_amp_avg_s0_d2<uint_16> the average value during the S0 state in the d2 subdivision
pulse_amp_avg_s0_d3<uint_16> the average value during the S0 state in the d3 subdivision
pulse_amp_avg_s0_d4<uint_16> the average value during the S0 state in the d4 subdivision
pulse_amp_avg_s0_d5<uint_16> the average value during the S0 state in the d5 subdivision
pulse_amp_avg_s0_d6<uint_16> the average value during the S0 state in the d6 subdivision
pulse_amp_avg_s0_d7<uint_16> the average value during the S0 state in the d7 subdivision Pulse Amplitude Max S0:
pulse_amp_max_s0_d0<uint_16> the maximum value during the S0 state in the d0 subdivision
pulse_amp_max_s0_d1<uint_16> the maximum value during the S0 state in the d1 subdivision
pulse_amp_max_s0_d2<uint_16> the maximum value during the S0 state in the d2 subdivision
pulse_amp_max_s0_d3<uint_16> the maximum value during the S0 state in the d3 subdivision
pulse_amp_max_s0_d4<uint_16> the maximum value during the S0 state in the d4 subdivision
pulse_amp_max_s0_d5<uint_16> the maximum value during the S0 state in the d5 subdivision
pulse_amp_max_s0_d6<uint_16> the maximum value during the S0 state in the d6 subdivision
pulse_amp_max_s0_d7<uint_16> the maximum value during the S0 state in the d7 subdivision Pulse Amplitude Min S0:
pulse_amp_max_s0_d0<uint_16> the minimum value during the S0 state in the d0 subdivision
pulse_amp_max_s0_d1<uint_16> the minimum value during the S0 state in the d1 subdivision
pulse_amp_max_s0_d2<uint_16> the minimum value during the S0 state in the d2 subdivision
pulse_amp_max_s0_d3<uint_16> the minimum value during the S0 state in the d3 subdivision
pulse_amp_max_s0_d4<uint_16> the minimum value during the S0 state in the d4 subdivision
pulse_amp_max_s0_d5<uint_16> the minimum value during the S0 state in the d5 subdivision
pulse_amp_max_s0_d6<uint_16> the minimum value during the S0 state in the d6 subdivision
pulse_amp_max_s0_d7<uint_16> the minimum value during the S0 state in the d7 subdivision Pulse Amplitude Max Time S1 (relative to edge threshold): <16 bit unsigned integer>' time stamp for where maximum occurred within a given pulse state for a 1st sub-division Pulse Amplitude Min Time S1 (relative to Edge Threshold) <16 bit unsigned integer>' time stamp for where minimum occurred within a given pulse state, for 1st sub-division Pulse Amplitude Max Time S0 (relative to Edge Threshold) <16 bit unsigned integer>' time stamp for where maximum occurred within a given pulse state, for 1st sub-division Pulse Amplitude Min Time S0 (relative to Edge Threshold)<16 bit unsigned integer>' time stamp for where minimum occurred within a given pulse state, for 1st sub-division A pulse window can be defined by the cycle size, and the optical sensor signal 131 may repeat during the configurable window, depending on the window width setting. By way of example, in a 100 ms capture time with a 9 kHz, 50% signal, the window for the s0 state will be 55.55 us. In this example, the optical sensor signal 131 will repeat through the s0 state 900 times. Subdivision d0 in the s0 state will have minimum, maximum and average values. The maximum value is the maximum of all the maximums in the s0 state during subdivision d0. The minimum value is the minimum of all the minimums in the s0 during subdivision d0. The average value is the average of all the averages in the s0 during subdivision d0.

The subdivision size is based on dividing the time for S0 state (or S1 state) into N equal portions of time (where N is either 1, 2, 4, or 8 or some other number). One implementation includes:

1—count clocks of some other timing reference to determine the number of cycles that the S0 (or S1) state lasts 2—perform a right shift operation of either 0, 1, 2, or 3 bits This determines the subdivision size in terms of sample time. Once the size of the sample time for each subdivision is known, we can determine which subdivision is being analyzed, and compute the statistics for that subdivision.

Figure 11:
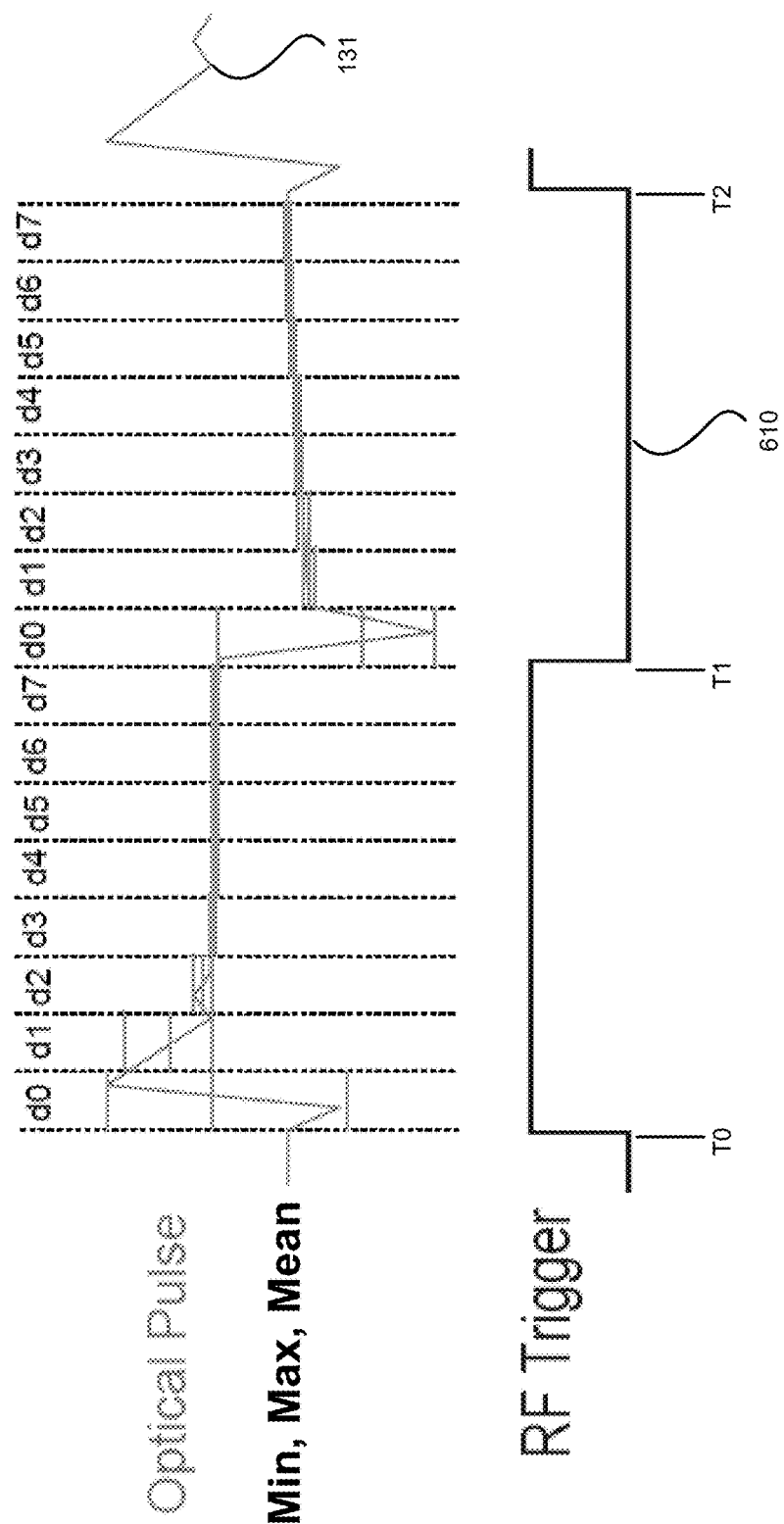
FIG. 11 is a diagram of the amplitude statistics for the pulse window having 8 subdivisions for RF trigger signal phases S1 and S0 that is shown in FIG. 10 above, for implementing embodiments of the present disclosure.

FIG. 11 is a diagram of the amplitude statistics for the pulse window having 8 subdivisions for RF trigger signal phases S1 and S0 that is shown in FIG. 10 above, for implementing embodiments of the present disclosure. The amplitude statistics analysis of each subdivision results in a version of the pulse window having only the 8 selected data points corresponding to the 8 subdivisions in each phase S1, S0 of the RF trigger signal.

Figure 12:
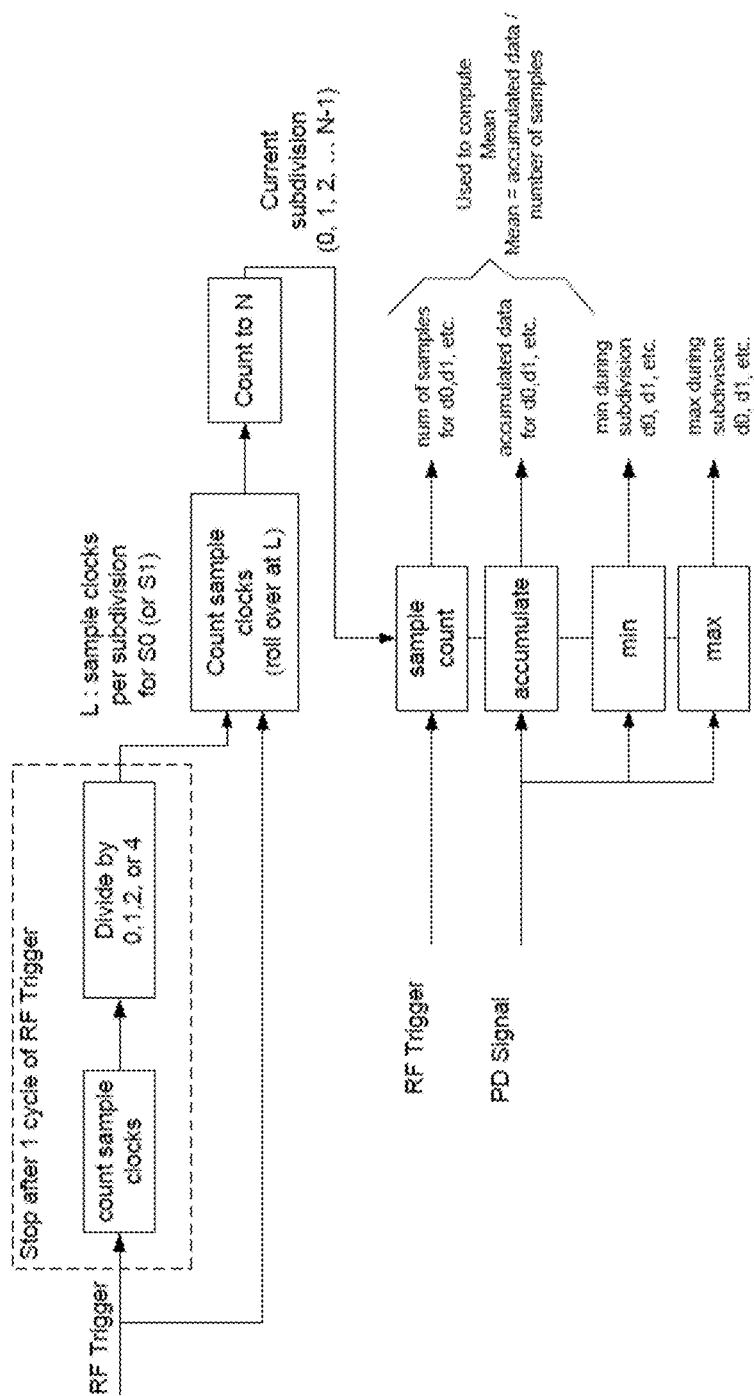
FIG. 12 is a simplified block diagram of an amplitude statistics system 1100 that can be included in the optical pulsed plasma analyzer described above, for implementing embodiments of the present disclosure.

FIG. 12 is a simplified block diagram of an amplitude statistics system 1100 that can be included in the optical pulsed plasma analyzer 132 described above, for implementing embodiments of the present disclosure. The amplitude statistics system 1100 can determine amplitude statistics for either the S0 (or S1) state. The determined amplitude statistics can then be stored in the OPP data table 112 and output to the host system 140 as may be needed.

In one implementation the system controller can support an overall data rate of 10 MSPS. While the infinite impulse response filters are computationally light (only requiring 5 multiplication-addition operations per data point), the filters do run through all the data in the window (e.g., up to or greater than 1 million points for a 100 ms window size, depending on sampling rate).

Figure 13:
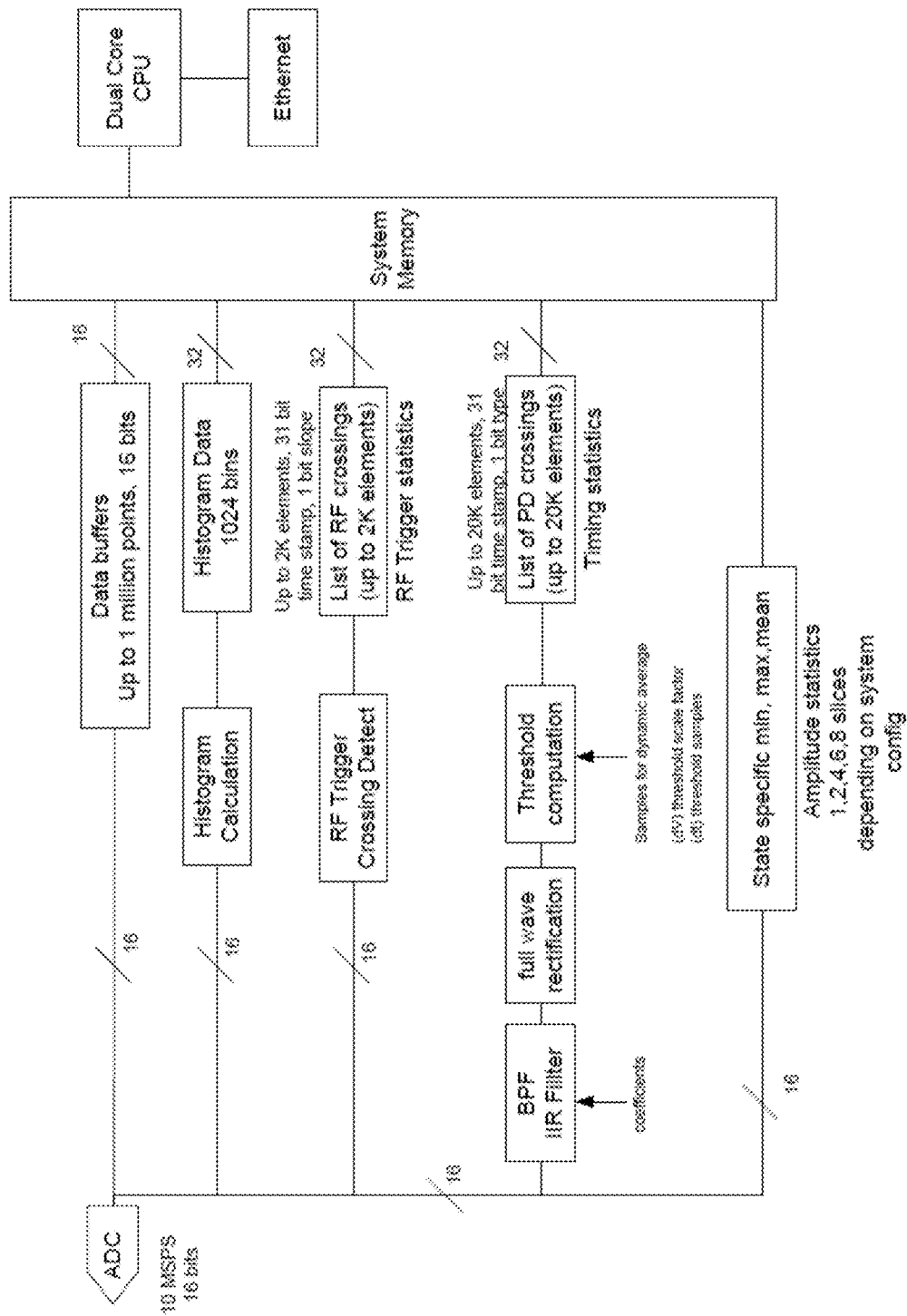
FIG. 13 is a simplified block diagram of a combined timing information extraction and amplitude statistics capable optical pulsed plasma analyzer, for implementing embodiments of the present disclosure.

FIG. 13 is a simplified block diagram of a combined timing information extraction and amplitude statistics capable optical pulsed plasma analyzer 1300, for implementing embodiments of the present disclosure.

The following is a list of parameters which may be changed to adjust the optical pulsed plasma analyzer 132 operations in various implementations:

| Adjustment | Description | Nominal | Range |
| --- | --- | --- | --- |
| Dynamic | # of samples from preceding TTL Rising Edge (20) S0 S1 Threshold Reference Level | 20 | [0 250] |
| Dynamic | # of samples from preceding TTL Falling Edge (20) S1 S0 Threshold Reference Level | 20 | [0 250] |
| S0 S1 | dV/dT @ TTL rising edge Rate of Rise | 10%/5 us | [1 100]%/[0.1 25.0]us |
| S1 S0 | dV/dT @ TTL falling edge Rate of Rise | 10%/5 us | [1 100] %/[0.1 25.0]us |
| Max Search Window | # of samples from TTL edge to search (40 us) | 400 | [1 499] |
| Minimum Magnitude Delta | % dV @ TTL edge OR Minimum Magnitude Delta]/dt, whichever is *larger magnitude* (ADC count) | 10 | [0 100] |
| Filter Coefficient values *a0, a1, a2, b0, b1, b2 | If coefficient values are not specified, the default values will be used. | (see BPF section) | (see BPF section) |
| | Values are 16 bit signed integer values in signed binary fractional format <S2.13> | | |
| pulse amplitude # subdivisions | Number of subdivisions per state 0 and state 1 | 8 | [1 8] |
| Pulse Width Window Size | Window Size (in milliseconds) for computing pulse width statistics, nominally equivalent to Ethernet poll rate | 100 ms | [1 100] ms |
| Pulse Amplitude Window Size | Window Size (in milliseconds) for computing pulse amplitude statistics, nominally equivalent to Ethernet poll rate | 100 ms | [1 100] ms |

A C simulation model implementation is provided to aid in understanding, exploring, and adjusting the optical pulsed plasma analyzer system 132. There is a complete environment allows the C code to be built into an executable program to simulate the optical pulsed plasma analyzer system 132. The C implementation also allows the optical pulsed plasma analyzer system 132 to undergo run tests using a standard set of inputs and generating a set of outputs. Multiple files of waveforms can be used to test the optical pulsed plasma analyzer system 132.

The C implementation and tests can be self-checking and can generate a corresponding PASS/FAIL/WARN message. The C implementation also allows the optical pulsed plasma analyzer system 132 to run multiple sets of parameters for a given data set.

Exemplary source code includes:

| | |
| --- | --- |
| algo_explore.c | main C code - the algorithm is found in the main function |
| algo_explore_utils.c | algorithm function calls (subsections of the algorithm) |
| dsp_func.c, .h | miscellaneous DSP functions used by algo_explore_utils.c |
| data_loader.c, .h | data loading and conversion |
| proc_args.c | process command line arguments |
| my_args.h, std_args.c | |

Parsing the Command Line
The command line parser is used to set algorithm parameters as well as to control simulator settings and outputs. The three elements are:
Simulator controllability
Algorithm Parameter Setting
Output observability (and limiting scope of outputs)
Generally command line options take the form of:
-setting_name
-setting_name setting_value
Settings are NOT position dependent except for setting values which must immediately follow setting names.
A full list of settings may be found by issuing the command:
algo_explore.exe -help Parsing the Command Line The command line parser is used to set algorithm parameters as well as to control simulator settings and outputs. The three elements are:

Simulator controllability
Algorithm Parameter Setting
Output observability (and limiting scope of outputs)
Generally command line options take the form of:
-setting_name
-setting_name setting_value
Settings are NOT position dependent except for setting values which must immediately follow setting names.
A full list of settings may be found by issuing the command:
algo_explore.exe -help
Reading Input Data
The input data is expected in a binary uint_16 bit format. The LSB contains the RF Trigger Signal. This effectively means that there are 15 bits of input data. By default, each data file is expected to be 1,000,000 points of data (unsigned). It should be noted that the electronics for optical pulsed plasma analyzer system 132 are set up such that absolute darkness will not yield a zero optical sensor 130 output signal value, instead there is an offset of 1573. The gain for an analog to digital converter on the optical sensor 130 can be about 30,932 per volt when measured at the HT Interface board monitoring point Vtp with an oscilloscope. The incremental count per volt is 30,932 for the selected optical sensor 130 (e.g., Highland Technology Model J710 Plasma Photodetector Technical Manual, Optical Interface ADC MB, which is incorporated by reference herein for all purposes).

For example purposes, a C implementation of the optical pulsed plasma analyzer system 132 can be processed using several example operations, more or less operations are possible depending on the chosen implementation. The example operations are:

Obtain the RF Frigger Crossings List from the RF Trigger times
BPF+Rectify the photo diode current data
Establishing a dynamic threshold for the current state
Slice the photo diode current signal with the dynamic threshold
Apply a threshold crossings adjustment factor, and as needed (rise time and fall time adjustments from data obtained at the start a 100 ms time slice)
Compute statistics (from photodiode crossings)

Generating Output
C-code can generate different types of output from intricately detailed output with various intermediate results, to a single line output with statistics, and a self-checking PASS/FAIL/WARN indicator. It should be understood that any program language can be used and the following program processes are only exemplary.
For full details use the -verbose command line option.
For less information (used when running multiple data sets) use the -quiet option.

When running a large number of test cases, it is often convenient to have a single line output. In this case use the -quiet option combined with the -sgl_line option. The format of the single line output is:

<input filename>, <rep rate>, <duty cycle>, <s1 width>, <s0 width>, <PASS|FAIL|WARN for rep rate with criteria, measured/ref>, <PASS|FAIL|WARN for duty cycle with criteria, measured/ref>

The self-check mechanism is implemented throughout entire system (in shell scripts as well as C code). The self-check mechanism is a self-check with the RF trigger signal. Statistics may be obtained directly from the RF trigger signal and if the statistics generated by the optical sensor 130 output current are in agreement with the RF trigger signal itself (within 1%) then the self-check mechanism will report PASS. If the results are >5% difference then the result is FAIL, and in-between will result in WARN.

The C-source code is compiled into an executable. A makefile is present at the top-level directory, to aid in the build process. The system has been tested under:

| | |
|---|---|
| Linux | Debian 7.4 |
| gcc | 4.7.2-1 |
| make | 3.81-8.2 |

To build the program, from the top level issue the command:
make build/algo_explore.exe The following is a .tar.gz directory structure:

| directory/file | description |
|---|---|
| readme.txt | a brief overview of all files, directories, and developments |
| src | c source code for the algorithm |
| build | build directory for c-compilation |
| data_vis | matlab utility functions (for visualization) and filter coefficient analysis |
| makefile | makefile used to build c-executable |
| run_test.cmd | script to run a single waveform (detailed output) |
| run_14.cmd | script to run 14 waveforms (less detailed output) |
| run_160.cmd | script to run 160 waveforms (least detailed info) |
| do_sweep.csh | change parameters and simulate sets of input waveforms |

Self-checking tests are a result of the self-check mechanism built in throughout the entire flow. The C program has an idea of the what. The C executable must be built before it can be run. It is built using a makefile called from the main top level. To build the main executable type the command:
Make build/algo.explore.exe To run the c executable, issue the command: ./build/algo_explore.exe -in_pd=nput file <optional parameters>

The following is a list of command line parameters, and how they map to elements of the optical pulsed plasma analyzer system 132:

| Adjustment | Description | Nominal | Range |
|---|---|---|---|
| Dynamic S0 S1 Threshold Reference Level | # of samples from preceding TTL Rising Edge (20) command line parameters: -pre_avg_time_rise <value> | 20 | [0 250] |
| Dynamic S1 S0 Threshold Reference Level | # of samples from preceding TTL Falling Edge (20) command line parameters: -pre_avg_level_rise | 20 | [0 250] |
| S0 S1 Rate of Rise | dV/dT @ TTL rising edge command line parameters: -pre_avg_level_rise <dV in % above 100%> (ie: 10 = +10% over the dynamic threshold) -pst_dt_win_rise <dt in samples: (ie: 50 = 5 us) > | 10%/5 us | [1 100]%/[0.1 25.0]us |

-continued

| Adjustment | Description | Nominal | Range |
|---|---|---|---|
| S1 S0 Rate of Rise | dV/dT @ TTL falling edge command line parameters: -pre_avg_level_fall <dV in % above 100%> (ie: 10 = +10% over the dynamic threshold) -pst_dt_win_fall <dt in samples: (i.e.,: 50 = 5 us) > | 10%/5 us | [1 100]%/[0.1 25.0]us |
| Max Search Window | # of samples from TTL edge to search command line parameters: -pst_win_allow_rise <dt in samples, i.e.,: 40 = 4 us> -pst_win_allow_fall <dt in samples, ie: 40 = 4 us> | 400 (40 us) | [1 499] |
| Minimum Magnitude Delta | [% dV @ TTL edge OR Minimum Magnitude Delta]/dt, whichever is *larger magnitude* command line parameters: -min_mag_delta <ADC count value> | 10 (ADC count) | [0 100] |
| Filter Coefficient values * | command line parameters: -coef <a0> <a1> <a2> <b0> <b1> < (a0, a1, a2, b0, b1, and b2 are floating point, all coefficient values must be provided if using -coef option) b2> | - (see BPF) | - (see BPF) |

Limiting Output

The -quiet option may be used to limit output. When -quiet is combined with the -sgl_line option, only a single line of output is produced. For rich details, use the -verbose option. In general, the following use model was intended:

-verbose: debugging individual waveforms
   -quiet: debugging several waveforms at once
   -quiet-sgl_line: used to debug a large set of data (only producing 1 line of output per waveform)

To run a single waveform through the simulator, it is possible to run directly from the command line, or use a script. There is a sample script provided called ./run_test.cmd To multiple waveforms through the system, it is best to use/modify one of the existing scripts. There are two scripts:
./run_14.cmd
./run_160.cmd: runs the 160 data set (305 waveforms total)
These scripts expect the following directories to exist:
../test_case_160/
../test_case_14/

There may be output files generated in the logs/logs_14 directory and logs/loga_160 directory. There is a summary.txt file with all PASS/FAIL results, as well as a summary_PASS.txt, summary_FAIL.txt and summary_WARN.txt.

The scripts to run multiple waveforms are written in .csh and intended to be run from a Linux box (however, a Virtual Machine works just as well).

Summary of Example Commands
run_14.cmd
run_160.cmd
run_test.cmd
algo_explore.exe
make build/algo_explore.exe Parameter Sweeping Overview Since several parameters to the program are chosen relatively arbitrarily (using what seemed like a reasonable value and iterative process), the question naturally comes to mind is there a parameter set which might maximize margin in the known/given set of waveforms to explore. A methodology to finding an optimal set of parameters is to try different parameters in the search space and find a set which is maximally "distant" from the point of introducing WARN/FAIL results. In this way, we may explore the search space, and find the edges (of PASS), and pick a solution which is furthest away from the edges.

The host system 140 can compare the received amplitude statistics, the received timing statistics and the received RF timing signal statistics to previously recorded statistics or an ideal statistic. The host can then provide feedback to the system controller 107 for adjusting the various parameters of the plasma processing system 100 corresponding to detected differences between the compared statistics.

By way of example, the received amplitude statistics can be compared to an ideal set of amplitude statistics for the plasma process being conducted in the plasma chamber 120. Differences between the received amplitude statistics and the ideal amplitude statistics can be correlated to one or more plasma process parameter adjustments such as frequency, power, pressure, duty cycle, temperature, distance between the upper and lower electrodes, plasma constituent gases, plasma byproducts and many more possible plasma operations parameters.

Figure 14:
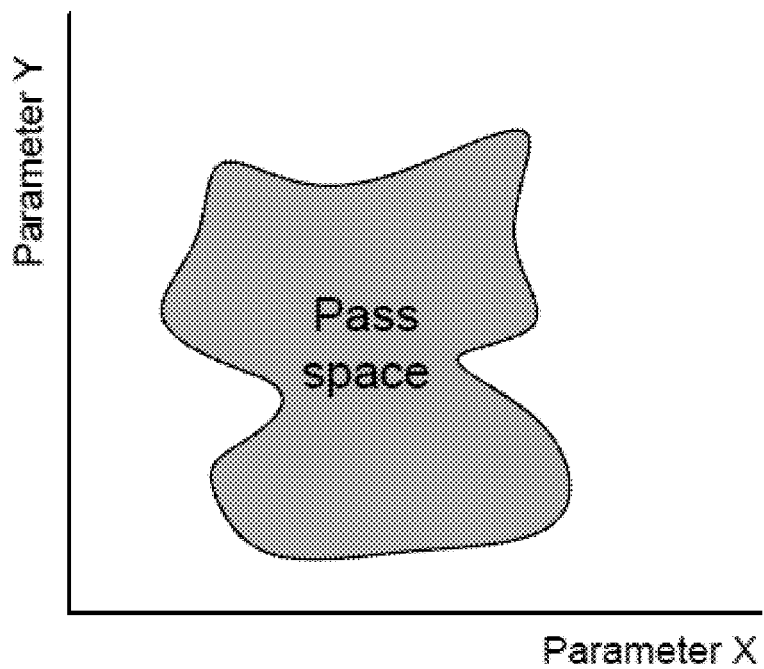
FIGS. 14-17 describe an exemplary analysis of a PASS/FAIL space for a plasma processing parameter X and parameter Y.

For instance, if we were to show in two dimensions, the PASS/FAIL space for parameter X and parameter Y, it might look like FIG. 14.

Figure 15:
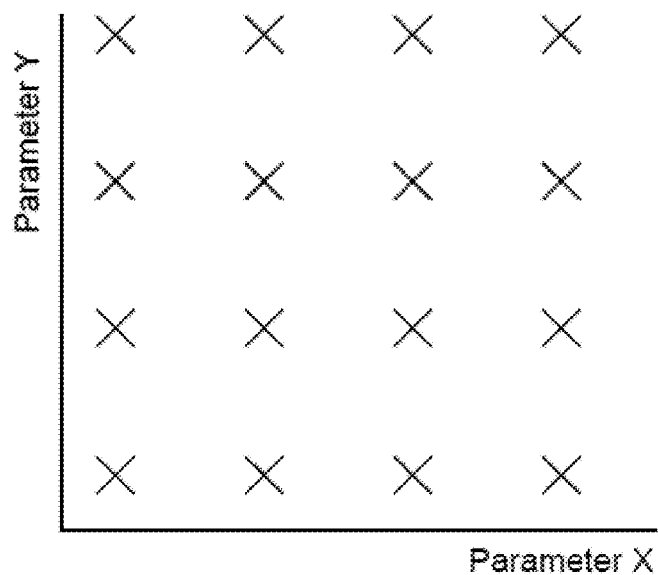

Discrete points in the space can be sampled at regularly spaced intervals, our sample points might look like FIG. 15

Figure 16:
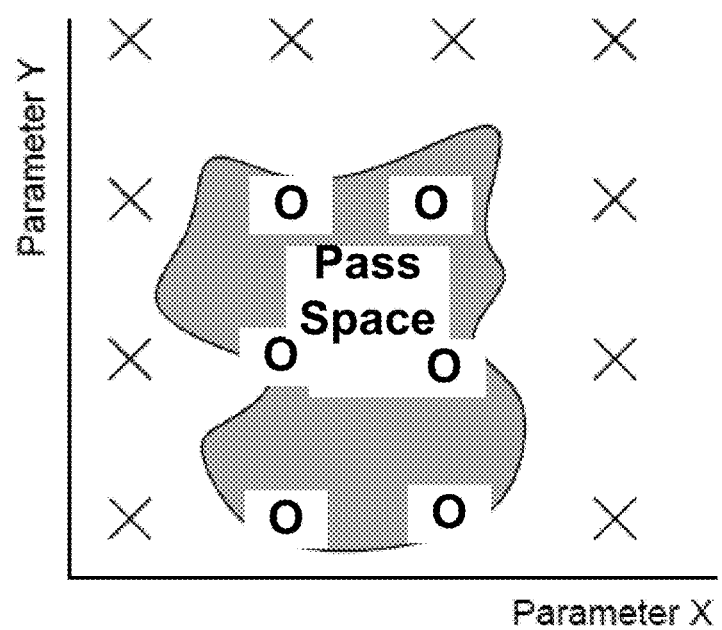
Figure 17:
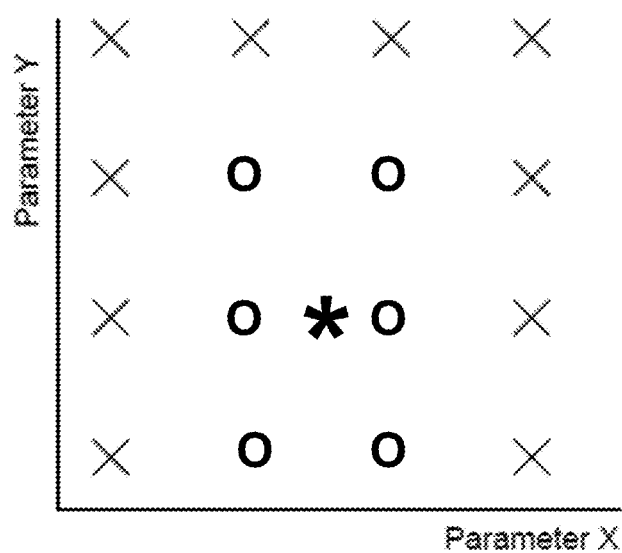

By intersecting FIG. 14 and FIG. 15: parameter space-points tested, we get an ideal of what our results might look like (FIG. 16):

In FIG. 17 the "0" points in the sample space which have passed. We cannot gain an accurate picture of the complexities of the boundaries of the PASS space, but we have an idea that might have certain dimensions. By finding the "*" point which is furthest from the edges of this known pass space, we might optimize our sample criteria (among the two parameters X and Y), as shown in the "0" points.

Applying this technique to a set of N parameters, a set of N basis vectors for the search space are formed. In the above example, when searching between two parameters X and Y with 4 points chosen for X and 4 points chosen for Y, we have 4×4=16 parameter sets which need to be tested.

For 6 parameters, for which each parameter might take 3 values in the selected sample space, and sampling 3^6=729 points in the sample space.

To run a parameter sweep, issue the command:
   ./do_sweep.csh

Parameter Sweep results are found in the file: sweep_res.txt

Every line on the parameter sweep_res.txt is composed of:

Each line on the parameter sweep represents an entire set of waveforms (14 or 305 waveform results) simulated with a given parameter setting, and the number of waveforms which PASSED, FAIL, and WARN, combined with a PASS/FAIL/WARN overall output. If any of the waveforms FAIL, then the entire set will FAIL. If no waveforms FAIL, but any WARN, then set will be labeled WARN. If all the waveforms PASS (no FAIL, and no WARN), then the waveform set will PASS.

The format of the result line (for do_sweep.csh) is as follows:

parameter: <pre_avg_time_rise>, <pre_avg_lev_rise>, <pst_win_time_rise>, <pre_avg_time_fall>, <pre_avg_lev_fall>, <pst_win_time_fall>, : result : <# pass>, <# fail>, <# warn>, <PASS|FAIL|WARN> a sample output is:

parameter: 25, 20, 400, 50, 10, 400, result: 14, 0, 0, PASS

In one implementation a plasma processing system can include a plasma chamber having at least one optical sensor directed toward a plasma region in the plasma chamber. At least one RF generator is coupled to the plasma chamber through a match circuit. An RF timing system is coupled to the RF generator and a system controller is coupled to the plasma chamber, the RF generator, the optical sensor, the RF timing system and the match circuit. The system controller can include a central processing unit, a memory system, a set of RF generator settings and an optical pulsed plasma analyzer coupled to the optical sensor and being capable to determine a set of amplitude statistics corresponding to an amplitude of the optical emission received in the optical sensor.

Another implementation can include a method of determining an amplitude statistics corresponding to an amplitude of the optical emission received in the optical sensor. The method including receiving an optical plasma emission in an optical sensor, outputting an optical sensor signal from the optical sensor. At least one phase of a timing reference signal can be subdivided into multiple subdivisions. An amplitude statistic of the output optical sensor signal can be determined and stored for each of the subdivisions.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code and/or logic on a computer readable medium. The computer readable medium is any data storage device that can store data which can thereafter be read by a computer system. Examples of the computer readable medium include hard drives, network attached storage (NAS), logic circuits, read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A plasma processing system comprising:
    a plasma chamber having a plasma region associated with an optical sensor that is directed toward the plasma region, wherein the optical sensor is configured to capture an optical emission from the plasma region, and the optical sensor produces an output sensor signal for the optical emission;
    at least one RF generator coupled to the plasma chamber through a match circuit;
    an RF timing system coupled to the at least one RF generator, wherein the RF timing system is configured to generate a timing reference signal; and
    a system controller coupled to the optical sensor, wherein the system controller is configured to process an optical pulsed plasma analyzer, wherein the optical pulsed plasma analyzer is configured to receive the output sensor signal from the optical sensor and is further configured to determine a set of amplitude statistics corresponding to an amplitude of the optical emission captured by the optical sensor, wherein to determine the set of amplitude statistics, the optical pulsed plasma analyzer is configured to,
        subdivide a state of the timing reference signal into a plurality of time intervals; and
        identify an amplitude statistic of the output sensor signal for each of the time intervals to control a setting of the at least one RF generator.

2. The system of claim 1, wherein the optical pulsed plasma analyzer is configured to determine a time of a change in a state of the output sensor signal by determining that an amplitude of the output sensor signal within a sample duration window exceeds a selected set point at the time.

3. The system of claim 2, wherein the sample duration window is offset a selected amplitude from a pretrigger average amplitude, wherein the output sensor signal is settled at the pretrigger average amplitude before a time of transition of the timing reference signal from an additional state to the state.

4. The system of claim 2, wherein the sample duration window is delayed by a selected time delay.

5. The system of claim 2, wherein the optical pulsed plasma analyzer is configured to select the sample duration window for determining the time of the change in the state of the output sensor signal.

6. The system of claim 1, wherein the optical pulsed plasma analyzer is configured to determine a change in amplitude of the output sensor signal a plurality of times within a selected sample duration window.

7. The system of claim 1, wherein the system controller includes a memory system coupled to the optical pulsed plasma analyzer for storing the amplitude statistic of the output optical sensor signal for each of the time intervals.

8. A plasma processing system comprising:
    a plasma chamber having a plasma region associated with an optical sensor, wherein the optical sensor is directed toward the plasma region to capture an optical emission, wherein the optical sensor is configured to produce an output sensor signal upon capturing the optical emission;
    an RF timing system configured to generate a timing reference signal; and
    a system controller coupled to the plasma chamber, the optical sensor, and the RF timing system, wherein the system controller is configured to process an optical pulsed plasma analyzer, wherein the optical pulsed plasma analyzer is configured to determine a change in a state of the output sensor signal and a set of amplitude statistics corresponding to an amplitude of the optical emission captured by the optical sensor, wherein to determine the set of amplitude statistics, the optical pulsed plasma analyzer is configured to,
        subdivide a state of the timing reference signal into a plurality of time intervals; and
        determine an amplitude statistic of the output sensor signal for each of the time intervals.

9. A method comprising:
    receiving an output sensor from an optical sensor, wherein the output sensor signal is generated when the optical sensor captures an optical plasma emission;

filtering the output sensor signal to produce a filtered optical signal;

rectifying the filtered optical sensor signal to produce a rectified and filtered output sensor signal;

determining a dynamic threshold level of the rectified and filtered output sensor signal occurring before a change in a state of a timing reference signal; and detecting a change in a state of the rectified and filtered output sensor signal occurring after the change in the state of the timing reference signal; and determining a set of amplitude statistics corresponding to an amplitude of the optical plasma emission captured by the optical sensor, wherein said determining the set of amplitude statistics includes:

subdividing the state of the timing reference signal into a plurality of time intervals; and determining an amplitude statistic of the output sensor signal for each of the time intervals to control a setting of a radio frequency (RF) generator.

10. The method of claim 9, wherein detecting the change in the state of the rectified and filtered output sensor signal includes determining that an amplitude of the rectified and filtered output sensor signal within a sample duration window exceeds a selected set point.

11. The method of claim 10, wherein the sample duration window is offset a selected amplitude from a pretrigger average amplitude, wherein the rectified and filtered output sensor signal is settled at the pretrigger average amplitude before a time of transition of the timing reference signal from an additional state to the state.

12. The method of claim 10, wherein the sample duration window is delayed by a selected time delay.

13. The method of claim 10, further comprising selecting the sample duration window for determining a time of the change in the state of the rectified and filtered output sensor signal.

14. The method of claim 10, wherein said determining the change in the state includes determining a change in amplitude of the rectified and filtered output sensor signal a plurality of times within the sample duration window.

15. The method of claim 10, further comprising storing the amplitude statistic of the rectified and filtered output sensor signal for each of the time intervals.

* * * * *